US007301388B2

(12) United States Patent
Kim

(10) Patent No.: US 7,301,388 B2
(45) Date of Patent: Nov. 27, 2007

(54) CHARGE PUMP WITH ENSURED PUMPING CAPABILITY

(75) Inventor: Jongjun Kim, Santa Clara, CA (US)

(73) Assignee: Mosel Vitelic Corporation, San Jose, CA (US)

( * ) Notice: Subject to any disclaimer, the term of this patent is extended or adjusted under 35 U.S.C. 154(b) by 227 days.

(21) Appl. No.: 11/021,979

(22) Filed: Dec. 22, 2004

(65) Prior Publication Data

US 2006/0133176 A1 Jun. 22, 2006

(51) Int. Cl.
*G05F 3/02* (2006.01)
(52) U.S. Cl. .......................... 327/536; 363/59
(58) Field of Classification Search ............... 327/536
See application file for complete search history.

(56) References Cited

U.S. PATENT DOCUMENTS

| 5,767,733 | A | * | 6/1998 | Grugett ...................... 327/534 |
| 5,973,979 | A | | 10/1999 | Chang et al. ............... 365/226 |
| 6,026,003 | A | | 2/2000 | Moore et al. ................. 363/60 |
| 6,130,574 | A | * | 10/2000 | Bloch et al. ................ 327/536 |
| 6,198,342 | B1 | | 3/2001 | Kawai ........................ 327/536 |
| 6,452,438 | B1 | * | 9/2002 | Li ............................... 327/536 |
| 6,492,861 | B2 | | 12/2002 | Rey et al. .................... 327/536 |
| 6,677,806 | B2 | * | 1/2004 | Bloch ......................... 327/536 |
| 6,831,499 | B2 | * | 12/2004 | Oddone et al. ............. 327/536 |
| 6,878,981 | B2 | * | 4/2005 | Eshel .......................... 257/299 |
| 6,888,400 | B2 | * | 5/2005 | Lin et al. .................... 327/536 |

OTHER PUBLICATIONS

Dickson, "On-chip high-voltage generation in MNOS integrated circuits using an improved voltage multiplier technique," *IEEE J. Solid-State Circs.*, vol. SC-11, Mar. 1976, pp. 374-378.
Shin et al., "A New Charge Pump Without Degradation in Threshold Voltage Due to Body Effect," *IEEE J. Solid-State Circs.*, vol. 35, Aug. 2000, pp. 1227-1230.
Tanazawa et al., "A Dynamic Analysis of the Dickson Charge Pump," *IEEE J. Solid-State Circs.*, vol. 32, Aug. 1997, pp. 1231-1240.

* cited by examiner

*Primary Examiner*—Kenneth B. Wells
*Assistant Examiner*—Ryan C. Jager
(74) *Attorney, Agent, or Firm*—Ronald J. Meetin

(57) ABSTRACT

An n-stage charge pump contains n primary capacitive elements ($C_{C1}$-$C_{Cn}$ or $C_{D1}$-$C_{Dn}$), n+1 charge-transfer cells ($60_1$-$60_{n+1}$, $110_1$-$110_{n+1}$, $120_1$-$120_{n+1}$, or $130_1$-$130_{n+1}$) respectively sequentially designated as the first through (n+1)th cells, and sources of first and second clock signals ($V_{CKP}$ and $\overline{V}_{CK\_P}$ or $V_{CKP1}$ and $V_{CKP2}$) approximately inverse to each other. Each pump stage ($62_i$, $112_i$, $122_i$, or $132_i$) includes one ($C_{Ci}$ or $C_{Di}$) of the capacitive elements and a corresponding one ($60_i$, $110_i$, $120_i$, or $130_i$) of the first through nth charge-transfer cells. Each cell contains a charge-transfer FET ($P_{Ti}$ or $N_{Ti}$). A pair of side FETs ($P_{Si}$ and $P_{Di}$ or $N_{Si}$ and $N_{Di}$) are provided in the first cell, in the (n+1)th cell, and normally in each remaining cell. The side FETs in the first cell or/and the (n+1) cell are connected in such a manner as to avoid undesired bipolar action that could cause degradation in the pump's voltage gain.

56 Claims, 13 Drawing Sheets

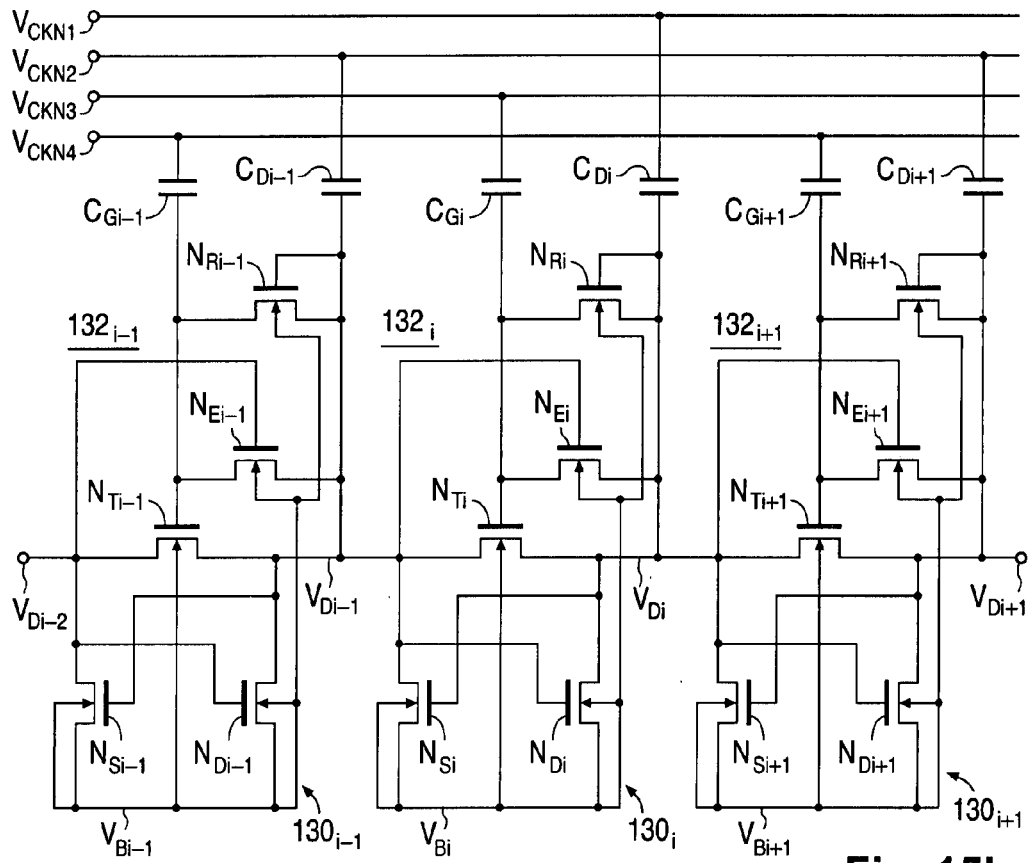
Fig. 15b
Fig. 16
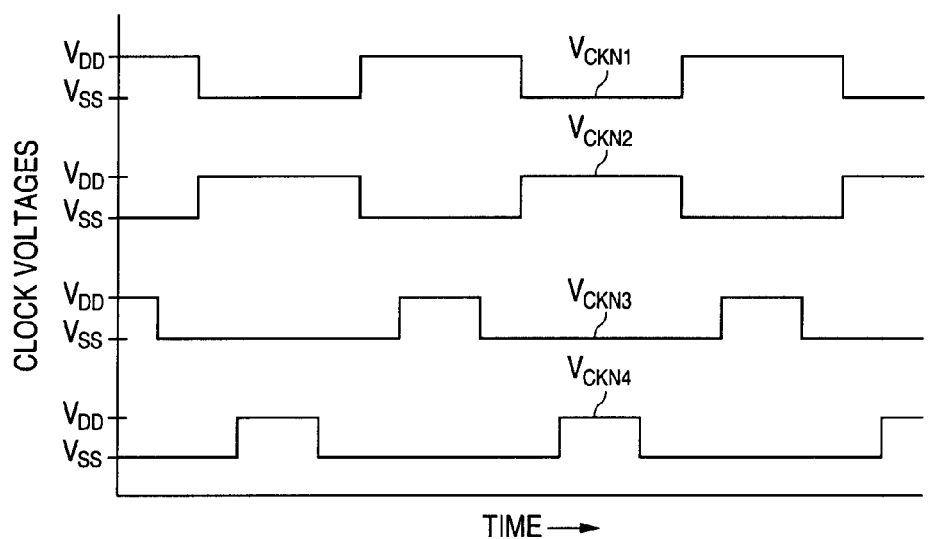

CHARGE PUMP WITH ENSURED PUMPING CAPABILITY

FIELD OF USE

This invention relates to electronic circuitry and, in particular, to charge pumps for use in integrated circuits.

BACKGROUND ART

A charge pump is an electronic circuit that uses a pumping technique to generate a pump output voltage outside the range of supply voltages from which the pump operates. When the pump output voltage is greater than the upper limit of the power-supply range, the pump is commonly referred to as a positive charge pump. A charge pump whose output voltage is less than the lower limit of the power-supply range is commonly referred to as a negative charge pump. A charge pump typically contains a group of pump stages arranged in series. Each stage provides an incremental voltage increase or decrease, generally referred to as the stage voltage gain, in the pump output voltage.

FIG. 1 illustrates a conventional n-stage positive diode charge pump whose power-supply range is from ground reference (0 V) to a high voltage denoted here as $V_{DD}$. The diode pump of FIG. 1 contains n substantially identical pn diodes $D_1$-$D_n$, n respectively corresponding pump capacitors $C_1$-$C_n$, output pn diode $D_{n+1}$, and output capacitor $C_O$ arranged as shown. Each pump stage consists of a diode $D_i$ and corresponding capacitor $C_i$ where i is an integer varying from 1 to n. High supply voltage $V_{DD}$ is provided as an input signal to the $D_1$ anode. Using output capacitor $C_O$ to reduce output voltage ripple, the $D_{n+1}$ cathode furnishes pump output voltage signal $V_{PP}$ at a relatively constant value greater than $V_{DD}$.

Clock voltage $V_{CK}$ is provided to odd-numbered pump capacitors $C_1$, $C_3$, and so on. Even-numbered pump capacitors $C_2$, $C_4$, and so on receive clock voltage $\overline{V}_{CK}$ inverse to clock voltage $V_{CK}$. Voltages $V_{CK}$ and $\overline{V}_{CK}$ vary between 0 and $V_{DD}$ at a suitable frequency as generally indicated in FIG. 2. The stage voltage gain is the same for each stage $D_i/C_i$ and can be as high as $V_{DD}$-$V_{pn}$ where $V_{pn}$ denotes the voltage at which each diode $D_i$ starts to conduct current. Since each stage $D_i/C_i$ has the same stage voltage gain, output voltage $V_{PP}$ increases linearly with the number n of stages.

The diode pump of FIG. 1 is a highly efficient device. However, diode turn-on voltage $V_{pn}$ is basically not scalable. As a result, the diode pump cannot be readily scaled downward as the power-supply voltage range is reduced in the course of decreasing the average integrated-circuit feature size. Also, providing an integrated circuit with pn diodes for a diode pump presents substantial fabrication difficulties.

The scaling and fabrication difficulties are overcome with the n-stage positive charge pump initially described in Dickson, "On-chip high-voltage generation in MNOS integrated circuits using an improved voltage multiplier technique," *IEEE J. Solid-State Circs.*, vol. SC-11, March 1976, pp. 374-378. FIG. 3 depicts the Dickson charge pump in which each diode $D_i$ of the diode pump of FIG. 1 is replaced with a diode-configured n-channel insulated-gate field-effect transistor ("FET") $Q_i$ whose drain and gate electrode are connected together. The body regions of FETs $Q_1$-$Q_{n+1}$ are all grounded.

The stage voltage gain for the ith stage of the Dickson pump can be as high as $V_{DD}$-$V_{Ti}$ where $V_{Ti}$ is the $Q_i$ threshold voltage. The high (or low) voltage at the source of each FET $Q_i$ increases as that FET $Q_i$ is further down the charge pump, i.e., as i increases. Because the body regions of FETs $Q_1$-$Q_n$ are all grounded and thus at the same electrical potential, FETs $Q_i$-$Q_n$ experience a body effect which causes threshold voltage $V_{Ti}$ to increase as i increases. The stage voltage gain thereby decreases with increasing i. For the same number of stages and same voltage conditions at the first stage, the Dickson pump is less efficient than the diode pump.

Shin et al. ("Shin"), "A New Charge Pump Without Degradation in Threshold Voltage Due to Body Effect," *IEEE J. Solid-State Circs.*, vol. 35, August 2000, pp. 1227-1230, addresses the efficiency loss of the Dickson pump with the n-stage positive charge pump shown in FIG. 4. Shin replaces each FET $Q_i$ of the Dickson pump with a three-FET charge-transfer cell $20_i$ consisting of p-channel charge-transfer FET $Q_{Ti}$, p-channel source-side FET $Q_{Si}$, and p-channel drain-side FET $Q_{Di}$ arranged as shown where i here varies from 1 to n+1. Each cell $20_i$ provides cell output voltage signal $V_{Di}$ at the interconnected gate electrode and drain of that cell's charge-transfer FET $Q_{Ti}$. Pump output voltage $V_{PP}$ is output voltage $V_{Dn+1}$ of output cell $20_{n+1}$. The body region of charge-transfer FET $Q_{Ti}$ in each cell $20_i$ is connected to the interconnected drains of side FETs $Q_{Si}$ and $Q_{Di}$ to receive body voltage signal $V_{Bi}$.

Consider a cell $20_i$ whose pump capacitor $C_i$ receives clock voltage $V_{CK}$. When voltage $V_{CK}$ goes low, charge-transfer FET $Q_{Ti}$ in that cell $20_i$ turns on as cell output voltage $V_{Di}$ rapidly drops by an amount approximately equal to $V_{DD}$. Charge passes through FET $Q_{Ti}$ to gradually raise voltage $V_{Di}$ by an amount less than $V_{DD}$. FET $Q_{Ti}$ turns off when clock voltage $\overline{V}_{CK}$ subsequently goes high. Voltage $V_{Di}$ rapidly increases by an amount approximately equal to $V_{DD}$. Since clock voltage $\overline{V}_{CK}$ goes low when voltage $V_{CK}$ goes high, charge-transfer FET $Q_{Ti+1}$ in next cell $20_{i+1}$ turns on. Charge passes through FET $Q_{Ti+1}$ to gradually reduce voltage $V_{Di}$ by an amount less than $V_{DD}$. When Shins's charge pump is in steady-state operation, cell output voltage $V_{Di}$ thereby returns to approximately the value existing when clock voltage $V_{CK}$ went low. However, voltage $V_{Di}$ is of an average value greater than that of input voltage $V_{Di-1}$ to cell $20_i$. The stage containing cell $20_i$ thus has a voltage gain.

Subject to bipolar-action difficulties which arise with first cell $20_1$ and output cell $20_{n+1}$ and which are discussed below in connection with FIGS. 6a and 6b, side FETs $Q_{S1}$-$Q_{Sn+1}$ and $Q_{D1}$-$Q_{Dn+1}$ operate generally in the following manner. When charge-transfer FET $Q_{Ti}$ in foregoing cell $20_i$ turns on due to clock voltage $V_{CK}$ going low, source-side FET $Q_{Si}$ turns on as drain-side FET $Q_{Di}$ turns off. The body region of charge-transfer FET $Q_{Ti}$ is temporarily electrically connected to its source by way of an electrical path through source-side FET $Q_{Si}$. The reverse occurs when clock voltage $V_{CK}$ goes high to turn charge-transfer FET $Q_{Ti}$ off. Drain-side FET $Q_{Di}$ turns on as source-side FET $Q_{Si}$ turns off. The body region of charge-transfer FET $Q_{Ti}$ is then temporarily electrically connected to its drain by way of an electrical path through drain-side FET $Q_{Di}$ so as to prevent body voltage $V_{Bi}$ from electrically floating.

Importantly and again subject to the below-described bipolar-action difficulties, the temporary electrical connections of the body regions of charge-transfer FETs $Q_{T1}$-$Q_{Tn+1}$ respectively to their sources when each FET $Q_{Ti}$ is in its conductive condition enables FETs $Q_{T1}$-$Q_{Tn+1}$ to all effectively have the same zero back-bias threshold voltage $V_{T0}$. Shin's pump largely avoids the body-effect threshold voltage increase, and the consequent stage voltage gain decrease, that arises with Dickson's pump as i increases. Shin presents a graph, substantially repeated in FIG. 5, which shows that Shin's pump is much more efficient than Dickson's pump and closely approaches the efficiency of the diode pump.

FIG. 6a cross-sectionally illustrates Shin's cell structure as applied to first cell $20_1$. P-type semiconductor substrate 22 is provided with n-well 24 having four p+ regions of which p+ region 26 serves commonly as the $Q_{T1}$ drain and the $Q_{D1}$ source. P+ region 28 is the $Q_{D1}$ drain and is electrically connected to n-well 24 by way of n+ contact region 30. P-substrate 22, n-well 24, and p+ region 26 respectively constitute the collector, base, and emitter of parasitic pnp bipolar transistor 32 having parasitic collector resistance 34 and parasitic base resistance 36.

Pnp transistor 32 needs to be turned off for first cell $20_1$ to operate properly. For transistor 32 to be turned off, cell output voltage $V_{D1}$ at emitter 26 needs to be less than a $V_{BE}$, typically 0.6-0.9 V, above body voltage $V_{B1}$ at base 24. When clock voltage $V_{CK}$ goes high, voltage $V_{D1}$ rapidly rises sufficiently above $V_{DD}$ that charge-transfer FET $Q_{T1}$ and source-side FET $Q_{S1}$ turn off. Drain-side FET $Q_{D1}$ is intended to turn on (strongly) and electrically connect its source 26 to n-well 24 by way of an electrical path through the $Q_{D1}$ channel region, $Q_{D1}$ drain 28, and contact region 30. When clock voltage $V_{CK}$ is high, body voltage $V_{B1}$ is thus intended to substantially equal cell output voltage $V_{D1}$ so that transistor 32 is turned off.

Fixed high supply voltage $V_{DD}$ applied to $Q_{D1}$ gate electrode 38 may, however, sometimes not be sufficiently less than cell output voltage $V_{D1}$ during an entire $V_{CK}$ high interval, especially since voltage $V_{D1}$ drops during the interval, for drain-side FET $Q_{D1}$ to be turned on strongly enough to ensure that body voltage $V_{B1}$ is sufficiently close to voltage $V_{D1}$ that pnp transistor 32 is turned off during the entire $V_{CK}$ high interval. Depending on various factors such as noise, manufacturing variations, and so on, body voltage $V_{B1}$ may occasionally float sufficiently low that pnp transistor 32 turns on and conducts current to substrate 22. This bipolar action reduces the stage voltage gain of first cell $20_1$. The stage voltage gain of later cells is also reduced so that the overall performance of Shin's pump is substantially degraded.

A similar, but complementary, bipolar-action phenomenon occurs in output cell $20_{n+1}$. Referring to FIG. 6b for a cross-sectional illustration of Shin's cell structure as applied to cell $20_{n+1}$, p-substrate 22 is further provided with n-well 40 having four p+ regions of which p+ region 42 serves as both the $Q_{Tn+1}$ source and the $Q_{Sn+1}$ source. P+ region 44 is the $Q_{Sn+1}$ drain and is electrically connected to n-well 40 by way of n+ contact region 46. P-substrate 22, n-well 40, and p+ region 42 respectively constitute the collector, base, and emitter of parasitic pnp bipolar transistor 48 having parasitic collector resistance 50 and parasitic base resistance 52.

FIG. 6b illustrates the case in which n is an even number so that pump capacitor $C_n$ receives clock voltage $\overline{V}_{CK}$. For pnp transistor 48 to be turned off as is necessary for output cell $20_{n+1}$ to operate properly, cell input voltage $V_{Dn}$ at emitter 42 must be less than a $V_{BE}$ above body voltage $V_{Bn+1}$ at base 40. When clock voltage $\overline{V}_{CK}$ goes high, voltage $V_{Dn}$ applied to $Q_{Dn+1}$ gate electrode 54 and $Q_{Tn+1}$ source 42 rapidly rises sufficiently above pump output voltage $V_{PP}$ at the $Q_{Dn+1}$ source and $Q_{Tn+1}$ gate electrode 56 that drain-side FET $Q_{Dn+1}$ turns off and charge-transfer FET $Q_{Tn+1}$ simultaneously turns on. With region 42 also being the source of source-side FET $Q_{Sn+1}$ and with its gate electrode 58 also receiving voltage $V_{Dn}$, FET $Q_{S1}$ is intended to likewise turn on (strongly) and electrically connect its source 42 to n-well 40 by way of an electrical path through the $Q_{S1}$ channel, $Q_{S1}$ drain 44, and contact region 46. When clock voltage $\overline{V}_{CK}$ is high, body voltage $V_{Bn+1}$ is thus intended to substantially equal cell input voltage $V_{Dn}$ so that transistor 48 is turned off.

Largely constant pump output voltage $V_{PP}$ applied to $Q_{Sn+1}$ gate electrode 58 may, however, sometimes not be sufficiently less than input voltage $V_{Dn}$ to output cell $20_{n+1}$ during an entire $\overline{V}_{CK}$ high interval, especially since voltage $V_{Dn}$ drops during the interval, for source-side FET $Q_{Sn+1}$ to be turned on strong enough to ensure that body voltage $V_{Bn+1}$ is sufficiently close to voltage $V_{Dn}$ that parasitic pnp transistor 48 is turned off during the entire $\overline{V}_{CK}$ high interval. Again depending on factors such as noise, manufacturing variations, and so on, body voltage $V_{Bn+1}$ may occasionally float sufficiently low that pnp transistor 48 turns on and conducts current to substrate 22. Shin's pump can lose much of its voltage gain dependent on how long and how strongly transistor 48 is turned on.

The efficiency of Shin's pump is potentially very high. It would be desirable to have a charge pump that operates similarly to Shin's pump but avoids the bipolar-action difficulties that handicap its performance.

GENERAL DISCLOSURE OF THE INVENTION

An n-stage charge pump in accordance with the invention contains n primary capacitive elements, n+1 charge-transfer cells respectively sequentially designated (for convenience) as the first through (n+1)th cells, and sources of first and second clock signals approximately inverse to each other. The n primary capacitive elements respectively correspond to the first through nth charge-transfer cells where n is at least 3. In particular, each primary capacitive element and the corresponding cell are components of one stage of the charge pump.

The charge-transfer cells employ like-polarity field-effect transistors, i.e., all p-channel for positive pumping or all n-channel for negative pumping. Each of these FETs has a gate electrode and first and second source/drain ("S/D") regions separated by a channel portion of a body region. Each cell typically uses three such FETs respectively referred to as the charge-transfer FET, the first side FET, and the second side FET.

A pump input signal is provided to the first S/D region of the charge-transfer FET in the first cell. The cells are arranged in series with the second S/D region of the charge-transfer FET of each cell except the (n+1)th cell coupled to the first S/D region of the charge-transfer FET of the next cell. A pump output signal is available at the second S/D region of the charge-transfer FET of the (n+1)th cell.

Each primary capacitive element is coupled between the second S/D region of the charge-transfer FET of the corresponding cell and (i) the source of the first clock signal if that cell is an odd-numbered cell or (ii) the source of the second clock signal if that cell is an even-numbered cell. The first and second S/D regions of the first side FET of each cell are respectively coupled to the first S/D and body regions of that cell's charge-transfer FET. The first and second S/D regions of the second side FET of each cell are respectively coupled to the second S/D and body regions of that cell's charge-transfer FET.

Unlike Shin's charge pump in which the gate electrodes of the source-side and drain-side FETs in every charge-transfer cell are connected the same cell-wise, the gate electrodes of the first and second side FETs in the present charge pump are connected differently in at least one of the first and (n+1)th cells than in the intervening n−1 cells. More particularly, the gate electrodes of the first and second side FETs of the first cell in the pump of the invention are typically respectively coupled to the second S/D region of the first cell's charge-transfer FET and the source of the second clock signal while the gate electrodes of the first and second side FETs of the (n+1)th cell are respectively coupled to a selected location in the pump and the first S/D region of the (n+1)th cell's charge-transfer FET. The gate electrodes of the first and second side FETs in each remaining cell are preferably respectively coupled to the second and first S/D regions of that remaining cell's charge-transfer FET.

The first S/D region of the second side FET of the first cell is coupled through one of the primary capacitive elements to the source of the first clock signal as a result of the above-described connections. The second side FET of the first cell thereby turns on in response to the first clock signal going to a suitable value.

By having the gate electrode of the second side FET of the first cell coupled to the source of the second clock signal in accordance with the invention, the difference between the voltages at the gate electrode and first S/D region of that FET is greater when it is conductive than what would occur if its gate electrode were, as arises with the gate electrode of the drain-side FET in Shin's first cell, coupled to the input node because the second clock signal is generally inverse to the first clock signal and, during conductive intervals for the second side FET of the first cell in the present charge pump, is at voltage further away from the voltage of the first clock signal than is the pump input voltage. This increased voltage difference prevents the second side FET of the first cell in the charge pump of the invention from turning off when the first clock signal is at the on value for that FET and, accordingly, prevents undesired bipolar action that could cause loss in the stage voltage gain of the first and later pump stages.

The charge pump of the invention normally includes circuitry for providing the gate electrodes of the charge-transfer FETs (a) of each odd-numbered cell with a control signal synchronized to the first clock signal and (b) of each even-numbered cell with a control signal synchronized to the second clock signal. In light of how the primary capacitive elements are variously coupled to the sources of the first and second clock signals, these connections can be partially implemented by connecting the gate electrode of the charge-transfer FET in each of the first through nth cells to that FET's second S/D region. The implementation is typically completed by coupling an additional capacitive element between the gate electrode of the (n+1)th cell's charge-transfer FET and (i) the source of the first clock signal if n is an even number or (ii) the source of the second clock signal if n is an odd number.

The gate electrode of the first side FET of the (n+1)th cell can be connected in various ways in accordance with the invention. In one embodiment, the gate electrode of the (n+1)th cell's first side FET is coupled to the second S/D region of the (n−1)th cell's charge-transfer FET, i.e., to the second S/D region of the charge-transfer FET in the cell two cells before the (n+1)th cell. With the charge pump containing the above-mentioned additional capacitive element, the gate electrode and second S/D region of the (n+1)th cell's charge-transfer FET are substantially electrically decoupled from each other. In that case, the gate electrode of the (n+1)th cell's first side FET can alternatively be coupled to the gate electrode of the (n+1)th cell's charge-transfer FET.

As a result of the above-described connections, the first S/D region of the first side FET of the (n+1)th cell is coupled through one of the primary capacitive elements to the source of a specified one of the first and second clock signals depending on whether n is even or odd. The first side FET of the (n+1)th cell turns on in response to the specified clock signal going to an appropriate value.

By connecting the gate electrode of the first side FET of the (n+1)th cell in either of the ways described above, the gate electrode of that FET is coupled through one of the capacitive elements to the source of the remaining one of the first and second clock signals. This enables the difference between the voltages at the gate electrode and first S/D region of that FET to be greater when it is conductive than what would occur if its gate electrode were, as arises with the gate electrode of the source-side FET in Shin's (n+1)th cell, coupled to the output node because, during conductive intervals for the first side FET of the (n+1)th cell in the present charge pump, the remaining clock signal is at voltage further away from the voltage of the specified clock signal than is the pump output voltage. This increased voltage difference prevents the first side FET of the (n+1)th cell in the present pump from turning off when the specified clock signal is at the on value for that FET and thereby avoids loss in the pump's overall voltage gain.

The charge pump of the invention operates as a two-phase device when it is controlled by only two clock signals. The pumping efficiency can be improved by utilizing two more clock signals to create a four-phase implementation. In particular, the present pump can be provided with sources of third and fourth clock signals different from the first and second clock signals. The four clock signals all vary substantially between first and second voltage values. The third clock signal is substantially at the first voltage value during pumping operation only during part of each time interval in which the first clock signal is substantially at the first voltage value. The fourth clock signal is similarly at the first voltage value during pumping operation only during part of each time interval in which the second clock signal is substantially at the first voltage value.

In addition to the n primary capacitive elements, the four-phase implementation of the charge pump of the invention contains n+1 further capacitive elements respectively corresponding to the n+1 cells. Each further capacitive element is coupled between the gate electrode of the charge-transfer FET of the corresponding cell and (i) the source of the third clock signal if that cell is an odd-numbered cell or (ii) the source of the fourth clock signal if that cell is an even-numbered cell. Each of the n pump stages thus contains two capacitive elements. Each cell is also typically provided with one or more additional FETs to appropriately interface between the capacitive elements of that cell's stage.

The four-phase implementation of the present charge pump may include an additional capacitive element coupled to the source of a selected one of the first and second clock signals, specifically the first clock signal if n is an even number or the second clock signal if n is an odd number. Instead of connecting the gate electrode of the first side FET of the (n+1)th cell in either of the preceding ways, the gate electrode of the first side FET of the (n+1)th cell can be connected to the additional capacitive element. In such an embodiment, the gate electrode and second S/D region of the (n+1)th cell's charge-transfer FET are normally configured so as not to be directly electrically connected to each other. The pump then typically includes at least one additional FET having its S/D regions coupled respectively to the gate electrodes of the (n+1)th cell's charge-transfer and first side FETs.

Coupling the gate electrode of the first side FET of the (n+1)th cell through the additional capacitive element to the source of the selected one of the first and second clock signals in the preceding manner enables the four-phase implementation of the charge pump of the invention to achieve the performance advantages attained by connecting the gate electrode of the (n+1)th cell's first side FET in either of the first two ways described above. That is, the difference between the voltages at the gate electrode and first S/D region of that FET is greater when it is conductive than what would occur if its gate electrode were coupled to the output node. The increased voltage difference again prevents loss in the pump's overall voltage gain.

Regardless of the number of clock signals employed by the present charge pump, certain of the side FETs in the cells between the first and (n+1)th cells can sometimes be connected differently than described above. While retaining the charge-transfer FETs, certain of the side FETs in the cells between the first and (n+1)th cells may even be absent in some embodiments.

In short, the present charge pump avoids bipolar action difficulties that can severely degrade the performance of Shin's pump. At the same time, the pump of the invention achieves an efficiency very close to the efficiency of a diode pump. Since the present pump employs FETs, it can readily be scaled to small dimensions and thereby avoids the scaling difficulties of the diode pump. Consequently, the invention provides a significant advance over the prior art.

BRIEF DESCRIPTION OF THE DRAWINGS

FIGS. 15a and 15b are circuit diagrams of a four-phase negative charge pump according to the invention.

FIG. 16 is a graph of idealized clock voltages for the charge pump of FIGS. 15a and 15b.

Like reference symbols are employed in the drawings and in the description of the preferred embodiments to represent the same, or very similar, item or items.

DESCRIPTION OF THE PREFERRED EMBODIMENTS

Figure 7A:
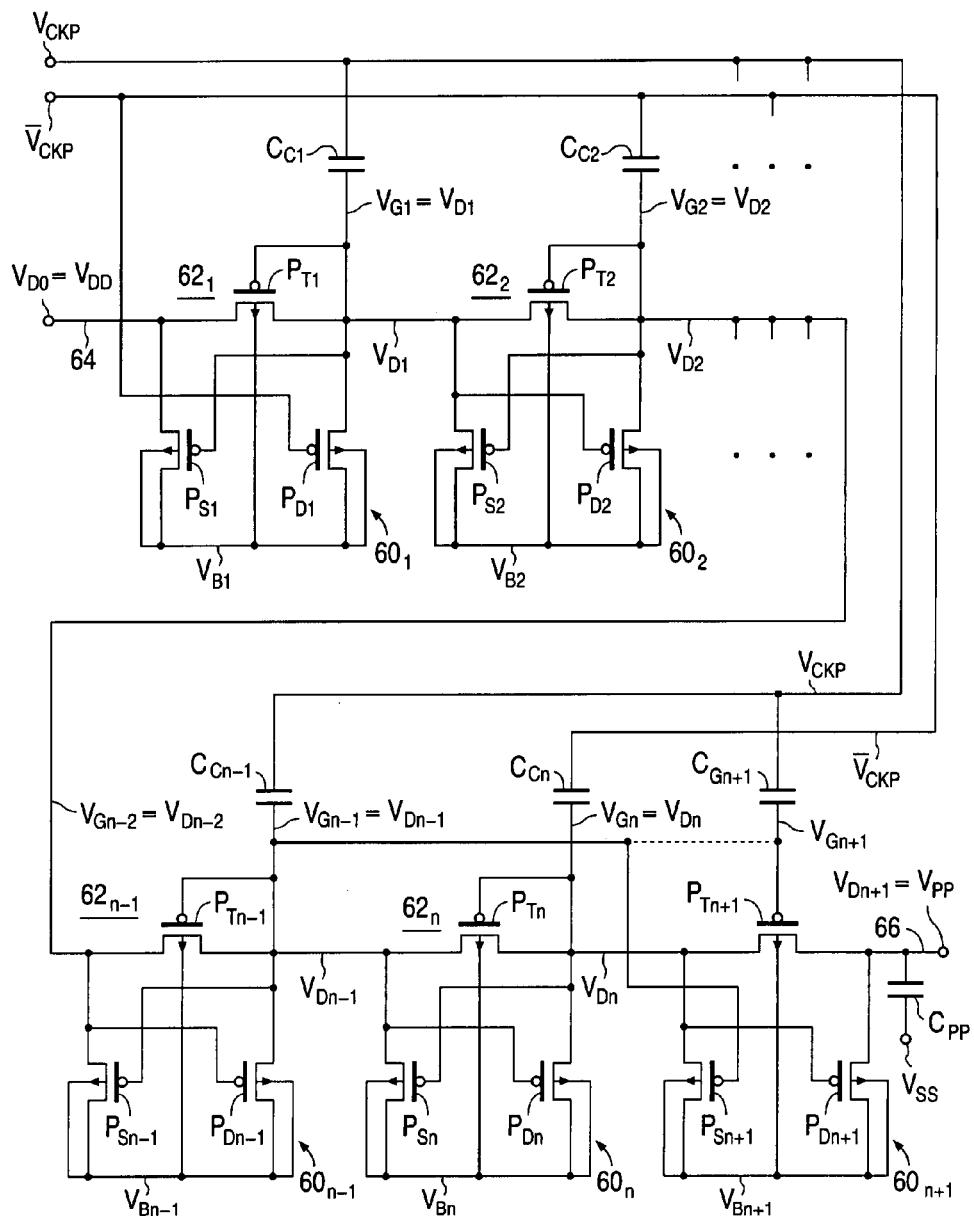
FIGS. 7a and 7b are circuit diagrams of a two-phase positive charge pump according to the invention.
Figure 7B:
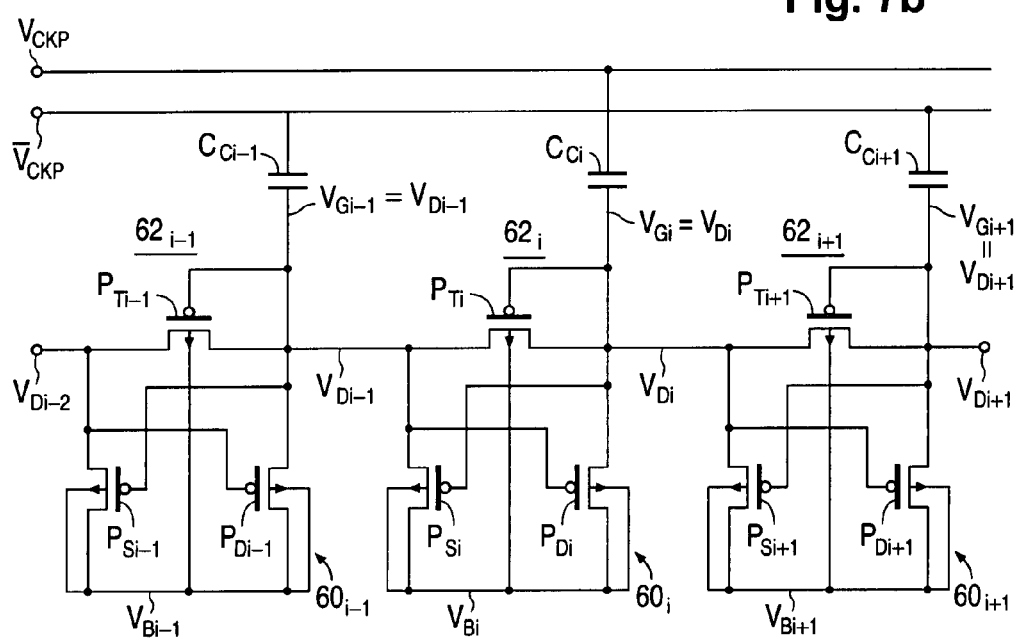

FIGS. 7a and 7b (collectively "FIG. 7") illustrate an n-stage two-phase positive charge pump in accordance with the invention. Beginning and end portions of the two-phase positive charge pump are depicted in FIG. 7a. An intermediate pump portion is depicted in FIG. 7b. The charge pump of FIG. 7 operates from a power supply that provides high supply voltage $V_{DD}$ and a low supply voltage $V_{SS}$, typically ground reference, which define a power-supply voltage range $V_{DD}$–$V_{SS}$. High supply voltage $V_{DD}$ is 2.5-4.0 V, typically 3.0 V, when low supply voltage $V_{SS}$ is ground reference.

The charge pump of FIG. 7 consists of n+1 charge-transfer cells $60_1$, $60_2$, ... $60_{n-1}$, $60_n$, and $60_{n+1}$ arranged in series, n substantially identical primary pump capacitive elements $C_{C1}$, $C_{C2}$, ... $C_{Cn-1}$, and $C_{Cn}$ respectively corresponding to charge-transfer cells $60_1$-$60_n$, an additional capacitive element $C_{Gn+1}$, an output capacitive element $C_{PP}$, and sources (not separately shown) of a first clock voltage signal $V_{CKP}$ and a second voltage clock signal $\nabla_{CK\ P}$ largely inverse to first clock voltage $V_{CKP}$. Each charge-transfer cell $60_i$ and corresponding primary capacitive element $C_{Ci}$ form a stage $62_i$ of the charge pump where integer i varies from 1 to n. Integer n, the number of pump stages $62_1$-$62_n$, is 3 or more. Hence, the pump of FIG. 7 has at least four charge-transfer cells $60_1$-$60_{n+1}$.

Each of capacitive elements $C_{C1}$-$C_{Cn}$ and $C_{Gn+1}$ can be implemented as a standard capacitor consisting of a dielectric layer sandwiched between two electrically conductive plates. However, to facilitate charge-pump manufacture in integrated-circuit form, each of capacitive elements $C_{C1}$-$C_{Cn}$ and $C_{Gn+1}$ is preferably implemented with one or more enhancement-mode or depletion-mode insulated-gate FETs whose source/drain regions are all electrically shorted together. A well capacitor is a semiconductor element configured substantially the same as such a capacitively connected FET except that the body region of the well capacitor is of the same conductivity type as, rather than being of opposite conductivity type to, the two interconnected laterally separated regions which extend along the upper semiconductor surface and which correspond to the source/drain regions of the capacitively connected FET. The body region of the well capacitor is more lightly doped than the two regions corresponding to the source/drain regions of the capacitively connected FET. Each of capacitive elements $C_{C1}$-$C_{Cn}$ and $C_{Gn+1}$ can also be implemented with one or more well capacitors.

Output capacitive element $C_{PP}$ may simply consist of the parasitic semiconductor load capacitance at the $C_{PP}$ location. If the value of the $C_{PP}$ parasitic capacitance is too low, the $C_{PP}$ value can be increased by combining the $C_{PP}$ parasitic capacitance with a non-parasitic (real) capacitor. Similar to capacitive elements $C_{C1}$-$C_{Cn}$ and $C_{Gn+1}$, the non-parasitic portion of capacitive element $C_{PP}$ can be implemented as a standard capacitor but, to facilitate charge-pump manufacture in integrated-circuit form, is preferably implemented with one or more capacitively connected FETs or one or more well capacitors.

Capacitively connected FETs and well capacitors function substantially the same as standard capacitors. Accordingly, capacitive elements $C_{C1}$-$C_{Cn}$, $C_{Gn+1}$, and $C_{PP}$ are often referred to below simply as "capacitors". The same applies to other such capacitive elements described below. A statement below that positive charge is transferred to or from a capacitor means that charge is transferred to or from the capacitor plate connected to an electrical line that carries the transferred charge.

A pump input voltage signal $V_{D0}$ at a value largely equal to high supply voltage $V_{DD}$ is provided on an input electrical conductor 64 to first cell $60_1$ in first stage $62_1$. While nth stage $62_n$ that contains nth cell $60_n$ is the last stage, (n+1)th cell $60_{n+1}$ is an output cell connected to an output electrical conductor 66 on which pump output voltage signal $V_{PP}$ is furnished at an approximately constant value greater than $V_{DD}$. Output capacitor $C_{PP}$ is connected between output conductor 66 and the $V_{SS}$ supply for reducing ripple in pump output voltage $V_{PP}$.

Figure 10A:
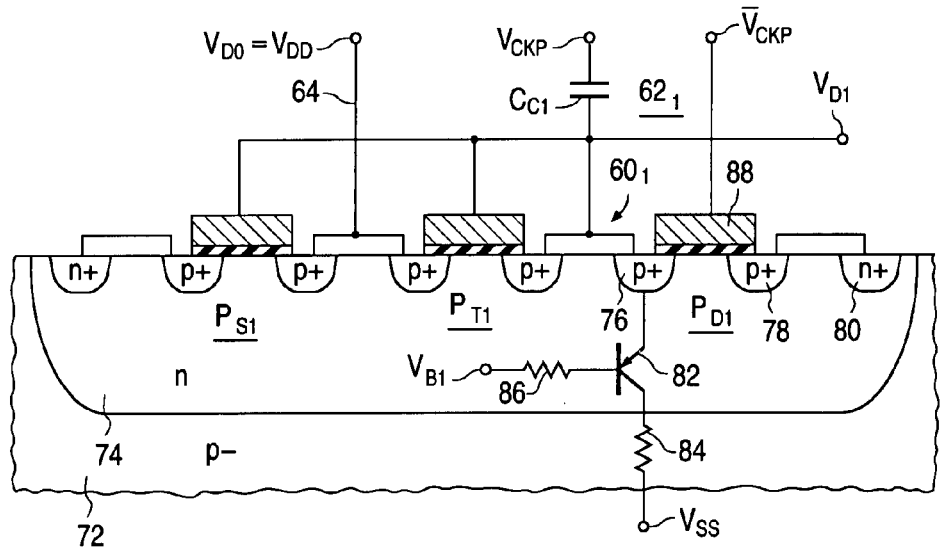
FIGS. 10a and 10b are a pair of composite circuit diagrams/side cross-sectional views for the first and output cells of the charge pump of FIGS. 7a and 7b.
Figure 10B:
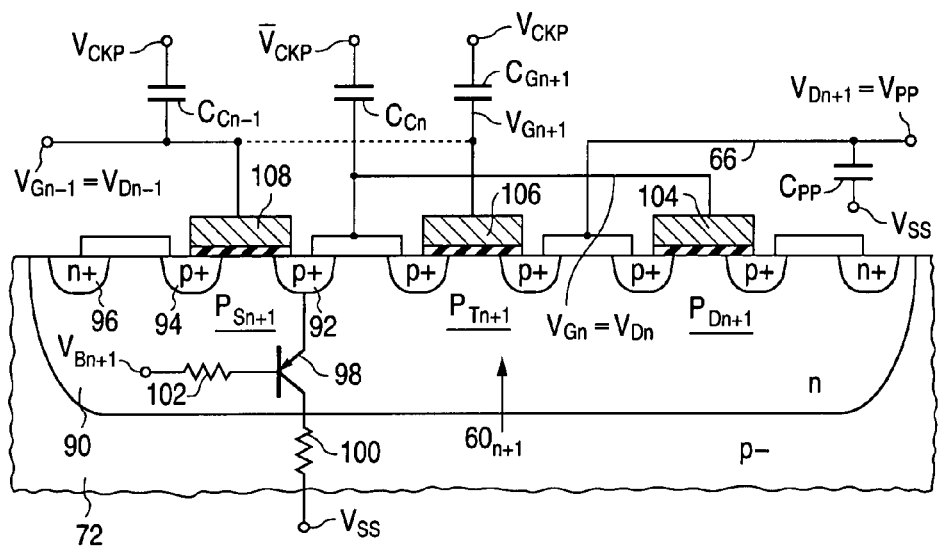

Charge-transfer cells $60_1$-$60_{n+1}$ are formed with enhancement-mode p-channel insulated-gate FETs, each having a first p-type source/drain region, a second p-type source/drain region, and a gate electrode for controlling current flow between the source/drain regions. The first and second source/drain (generally "S/D") regions of each FET are separated by a channel portion of an n-type body region that forms a pn junction with each of that FET's S/D regions. A gate dielectric layer separates the gate electrode of each FET from its channel portion. The first S/D region of each FET normally functions primarily as its source and is sometimes referred to below parenthetically as the "source". In a complementary manner, the second S/D region of each FET normally functions primarily as its drain and is sometimes referred to below parenthetically as the "drain". FIGS. 10a and 10b, discussed below, depict typical cross-sectional side views for the FETs in two of cells $60_1$-$60_{n+1}$.

Each charge-transfer cell $60_i$ consists of a charge-transfer FET $P_{Ti}$, a first side FET $P_{Si}$, and a second side FET $P_{Di}$ where i here varies from 1 to n+1. Charge-transfer FETs $P_{T1}$-$P_{Tn+1}$ are substantially identical. First side FETs $P_{S1}$-$P_{Sn+1}$ are substantially identical. Second side FETs $P_{D1}$-$P_{Dn+1}$ are substantially identical.

The first S/D region (source) of charge-transfer FET $P_{T1}$ of first cell $60_1$ is connected to input conductor 64 to receive pump input voltage $V_{D0}$ largely at $V_{DD}$ as an input signal to cell $60_1$. The second S/D region (drain) of charge-transfer FET $P_{Ti}$ in each cell $60_i$ except for output cell $60_{n+1}$ is connected to the first S/D region (source) of charge-transfer FET $P_{Ti+1}$ in next cell $60_{i+1}$. Each cell $60_i$ provides cell output voltage signal $V_{Di}$ from the second S/D region of that cell's charge-transfer FET $P_{Ti}$. Output voltage $V_{Di}$ from each cell $60_i$ except output cell $60_{n+1}$ is thus an input signal to next cell $60_{i+1}$. Alternatively stated, each cell $60_i$ receives voltage $V_{Di-1}$ as a cell input signal at the first S/D region of that cell's charge-transfer FET $P_{Ti+1}$. The second S/D region (drain) of charge-transfer FET $P_{Tn+1}$ in output cell $60_{n+1}$ is connected to output conductor 66 to provide output voltage $V_{Dn+1}$ from cell $60_{n+1}$ as pump output voltage $V_{PP}$.

A gate voltage signal $V_{Gi}$ is present at the gate electrode of charge-transfer FET $P_{Ti}$ in each cell $60_i$. For each odd value of i, gate voltage $V_{Gi}$ is synchronized to clock voltage $V_{CKP}$. Gate voltage $V_{Gi}$ for each even value of i is synchronized to clock voltage $\overline{V}_{CK\ P}$.

With particular reference to FIG. 7b, the following connections apply to each charge-transfer FET $P_{Ti}$ except FET $P_{Tn+1}$. For each odd value of i different from n+1, primary capacitor $C_{Ci}$ is connected between the second S/D region of FET $P_{Ti}$ and the source of clock voltage $V_{CKP}$. For each even value of i different from n+1, primary capacitor $C_{Ci}$ is connected between the second S/D region of FET $P_{Ti}$ and the source of clock voltage $\overline{V}_{CK\ P}$. The gate electrode of each FET $P_{Ti}$ is connected to its second S/D region. Except for FET $P_{Tn+1}$ and thus except for i equal to n+1, each capacitor $C_{Ci}$ is thereby connected between the interconnected gate electrode and second S/D region of FET $P_{Ti}$, on one hand, and (i) the $V_{CKP}$ source when i is an odd number or (ii) the $\overline{V}_{CK\ P}$ source when i is an even number, on the other hand. Likewise, each gate voltage $V_{Gi}$ except for gate voltage Vhd Gn+1 thereby equals cell output voltage $V_{Di}$ in the two-phase charge pump of FIG. 7.

As to output charge-transfer FET $P_{Tn+1}$, additional capacitor $C_{Gn+1}$ is connected between the gate electrode of FET $P_{Tn+1}$ and (i) the $V_{CKP}$ source if n is an even number or (ii) the $\overline{V}_{CK\ P}$ source if n is an odd number. FIG. 7a illustrates the example in which n is even. Importantly, the gate electrode of FET $P_{Tn+1}$ is electrically decoupled from its second S/D region. Gate voltage $V_{Gn+1}$ and pump output voltage $V_{PP}$ (or $V_{Dn+1}$) are thus separate signals.

The first and second S/D regions of first side FET $P_{Si}$ in each cell $60_i$ are respectively connected to the first S/D and body regions of that cell's charge-transfer FET $P_{Ti}$. The first and second S/D regions of second side FET $P_{Di}$ in each cell $60_i$ are similarly respectively connected to the second S/D and body regions of that cell's charge-transfer FET $P_{Ti}$. The body region of charge-transfer FET $P_{Ti}$ in each cell $60_i$ receives body voltage signal $V_{Bi}$ present at the interconnected second S/D regions (drains) of that cell's side FETs $P_{Si}$ and $P_{Di}$. The body regions of sides FETs $P_{Si}$ and $P_{Di}$ in each cell $60_i$ are also respectively connected to their second S/D regions to receive body voltage $V_{Bi}$.

The gate electrodes of side FETs $P_{Si}$ and $P_{Di}$ in each cell $60_i$ are, in accordance with the invention, connected differently in first cell $60_1$ and output cell $60_{n+1}$ than in each cell $60_i$ between cells $60_1$ and $60_{n+1}$. In particular, the gate electrode of second side FET $P_{D1}$ in first cell $60_1$ is connected to the $\overline{V}_{CK\ P}$ source to receive clock voltage $\overline{V}_{CK\ P}$. The gate electrode of second side FET $P_{Di}$ in each cell $60_i$ except cell $60_1$ is connected to the first S/D region of that cell's charge-transfer FET $P_{Ti}$ to receive cell input voltage $V_{Di-1}$. Inasmuch as the $P_{Ti}$ first S/D region is connected to the first S/D region (source) of first side FET $P_{Si}$, the gate electrode of second side FET $P_{Di}$ in each cell $60_i$ except cell $60_1$ is also connected to the $P_{Si}$ first S/D region.

The gate electrode of first side FET $P_{Si}$ in each cell $60_i$ except output cell $60_{n+1}$ is connected to the second S/D region of that cell's charge-transfer FET $P_{Ti}$ to receive cell output voltage $V_{Di}$. Since the $P_{Ti}$ second S/D region is connected to the first S/D region (source) of second side FET $P_{Di}$, the gate electrode of first side FET $P_{Si}$ in each cell $60_i$ except cell $60_{n+1}$ is also connected to the $P_{Di}$ first S/D region.

The gate electrode of first side FET $P_{Sn+1}$ in output cell $60_{n+1}$ of the two-phase charge pump of FIG. 7 can be connected in either of two ways in accordance with the invention. The $P_{Sn+1}$ gate electrode is typically connected to the second S/D region of charge-transfer FET $P_{Tn-1}$ in cell $60_{n-1}$, i.e., two cells earlier, to receive output voltage $V_{Dn-1}$ from cell $60_{n-1}$. Accordingly, primary capacitor $C_{Cn-1}$ is coupled between the $P_{Sn+1}$ gate electrode and (i) the source of clock voltage $V_{CKP}$ if n is an even number or (ii) the source of clock voltage $\overline{V}_{CK\ P}$ if n is an odd number. Alternatively, the $P_{Sn+1}$ gate electrode can be connected to the $P_{Tn+1}$ gate electrode, as indicated by dotted line in FIG. 7a, to receive gate voltage $V_{Gn+1}$. In that event, additional capacitor $C_{Gn+1}$ is coupled between the $P_{Sn+1}$ gate electrode and (i) the source of clock voltage $V_{CKP}$ if n is an even number or (ii) the source of clock voltage $\overline{V}_{CK\ P}$ if n is an odd number. Once again, FIG. 7a depicts the example in which n is even. Hence, the $P_{Sn+1}$ gate electrode is coupled through either capacitor $C_{Cn-1}$ or capacitor $C_{Gn+1}$ to the $V_{C_{KP}}$ source in the example of FIG. 7a.

Figure 8:
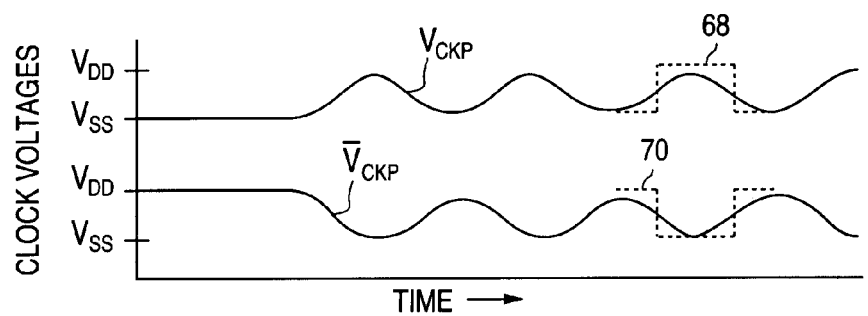
FIG. 8 is a graph of clock voltages for the charge pump of FIGS. 7a and. 7b.

During pumping operation, clock voltages $V_{CKP}$ and $\overline{V}_{CK\ P}$ vary in a periodic manner, i.e., at a selected clock frequency, between low supply voltage $V_{SS}$ and high supply voltage $V_{DD}$ or a high voltage close to $V_{DD}$. The clock frequency is 10-25 MHz, typically 20 MHz. As shown in FIG. 8, the $V_{CKP}$ and $\overline{V}_{CK\ P}$ waveforms are roughly sinusoidal during pumping operation. However, clock voltages $V_{C_{KP}}$ and $\overline{V}_{CK\ P}$ can be reasonably approximated with generally rectangular waveforms as indicated respectively by items 68 and 70 in FIG. 8.

Each pump stage $62_i$ for i varying from 1 to n contributes a stage voltage gain $\Delta V_{Di}$ to pump output voltage $V_{PP}$. An understanding of how each stage $62_i$ operates in generating its stage gain $\Delta V_{Di}$ is facilitated with the assistance of FIG. 9 which depicts idealized waveforms for cell output voltage $V_{Di}$, cell input voltage $V_{Di-1}$, and body voltage $V_{Bi}$ using rectangular waveform approximations for clock voltages $V_{CKP}$ and $\overline{V}_{CK\ P}$. Referring again particularly to FIG. 7b, the $V_{Di}$, $V_{Di-1}$, and $V_{Bi}$ waveforms shown in FIG. 9 apply specifically to a stage $62_i$ whose cell $60_i$ is situated between first cell $60_1$ and output cell $60_{n+1}$. Subject to the comments made below in connection with FIG. 10a, first stage $62_1$ operates the same as each other stage $62_i$.

Figure 9:
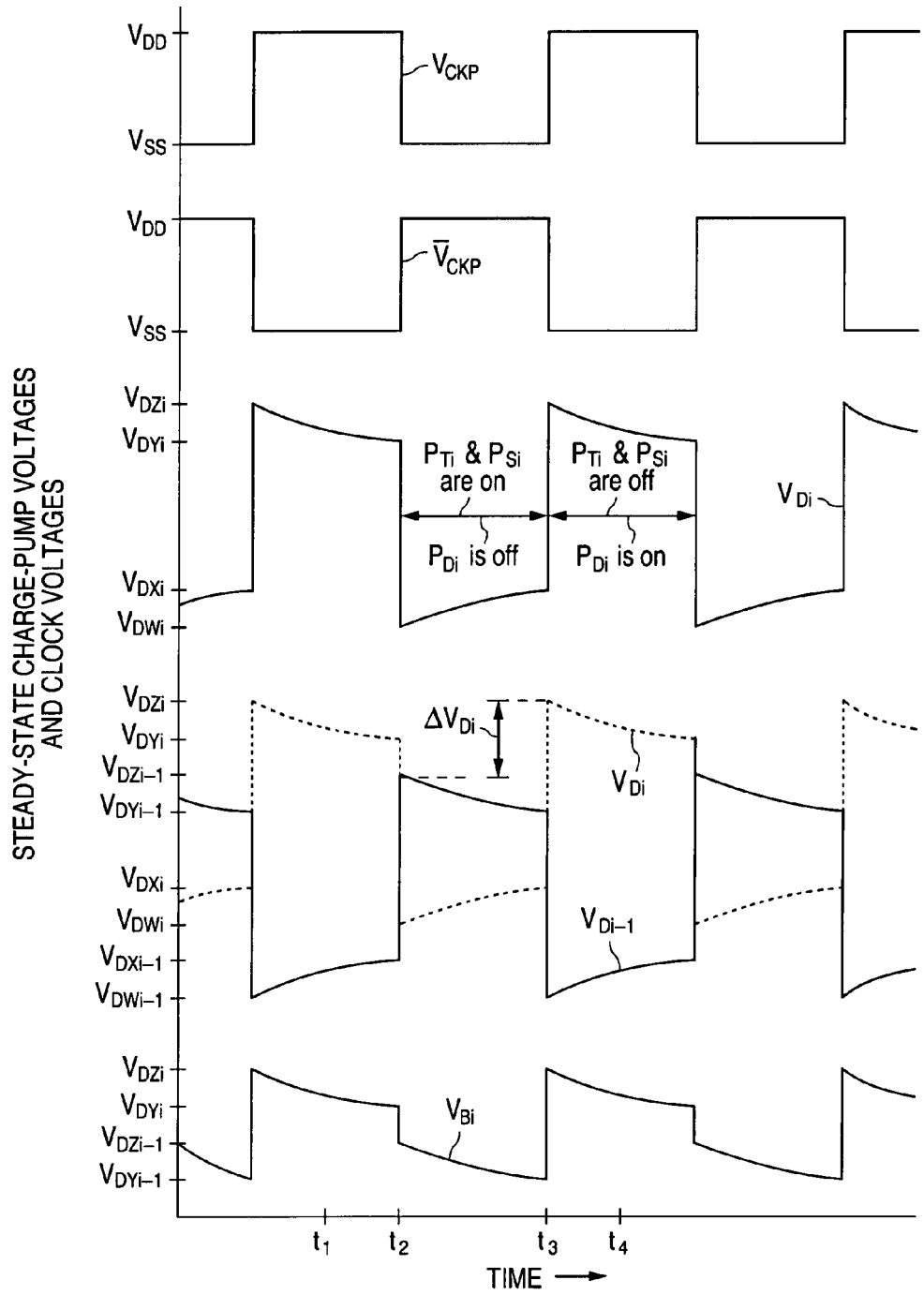
FIG. 9 is a graph of various voltages, including idealized clock voltages, for the charge pump of FIGS. 7a and 7b.

The $V_{Di}$, $V_{Di-1}$, and $V_{Bi}$ waveforms of FIG. 9 all apply to an odd-numbered stage $62_i$, i.e., a stage $62_i$ whose capacitive element $C_{Ci}$ receives clock voltage $V_{CKP}$. FIG. 7b illustrates this situation. Times $t_1$, $t_2$, $t_3$, and $t_4$ in FIG. 9 occur progressively later. At time $t_1$, clock voltage $V_{CKP}$ is high (at $V_{DD}$), and clock voltage $\overline{V}_{CK\ P}$ is low (at $V_{SS}$). Charge-transfer FET $P_{Ti}$ and first side FET $P_{Si}$ in cell $60_i$ of such an odd-numbered stage $62_i$ are turned off. Second side FET $P_{Di}$ is turned on.

The conditions in adjoining cells $60_{i-1}$ and $60_{i+1}$ at time $t_1$ are reversed from those in cell $60_i$. That is, charge-transfer FETs $P_{Ti-1}$ and $P_{Ti+1}$ and first side FETs $P_{Si-1}$ and $P_{Si+1}$ are turned on while second side FETs $P_{Di-1}$ and $P_{Di+1}$ are turned off. Output voltage $V_{Di}$ of cell $60_i$ is at a value between a high value $V_{DZi}$ and a slightly lower value $V_{D\overline{n}}$. Although not shown in FIG. 9, output voltage $V_{Di+1}$ of next cell $60_{i+1}$ is considerably less than voltage $V_{Di}$ at time $t_1$. Because charge-transfer FETs $P_{Ti}$ and $P_{Ti+1}$ are respectively off and on, positive charge is transferred from capacitor $C_{Ci}$ through FET $P_{Ti+1}$ to capacitor $C_{Ci+1}$. This causes output voltage $V_{Di}$ of cell $60_i$ to drop relatively gradually during the interval in which clock voltage $V_{CKP}$ is high.

At time $t_1$, input voltage $V_{Di-1}$ to cell $60_i$ is at a value between a low value $V_{D\overline{n}-1}$ and a slightly higher value $V_{DXi-1}$. Although not shown in FIG. 9, input voltage $V_{Di-2}$ to previous cell $60_{i-1}$ is considerably greater than voltage $V_{Di-1}$ at time $t_1$. Since charge-transfer FETs $P_{Ti}$ and $P_{Ti-1}$ are respectively off and on, positive charge is transferred from capacitor $C_{Ci-2}$ through FET $P_{Ti-1}$ to capacitor $C_{Ci-1}$ to raise voltage $V_{Di-1}$ relatively gradually. Body voltage $V_{Bi}$ equals output voltage $V_{Di}$ of cell $60_i$ at time $t_1$ since side FETs $P_{Di}$ and $P_{Si}$ are respectively on and off. Body voltage $V_{Bi}$ is thereby at a value between $V_{DZi}$ and $V_{D\overline{n}}$ and is dropping relatively gradually.

Cell output voltage $V_{Di}$ and body voltage $V_{Bi}$ momentarily both reach $V_{D\overline{n}}$ at time $t_2$ while cell input voltage $V_{Di-1}$ simultaneously momentarily reaches $V_{DXi-1}$. At time $t_2$, clock voltage $V_{CKP}$ transitions (relatively) rapidly from $V_{DD}$ down to $V_{SS}$ as clock voltage $\overline{V}_{CK\ P}$ makes a rapid opposite transition from $V_{SS}$ up to $V_{DD}$. In response to the $V_{CKP}$ drop of $V_{DD}-V_{SS}$, capacitor $C_{Ci}$ causes cell output voltage $V_{Di}$ to rapidly drop approximately the same amount to a low value $V_{D\overline{n}}$. Charge-transfer FET $P_{Ti}$ and first side FET $P_{Si}$ turn on. Second side FET $P_{Di}$ turns off.

In complementary response to the $\overline{V}_{CK\ P}$ rise of $V_{DD}-V_{SS}$, capacitor $C_{Ci-1}$ causes cell input voltage $V_{Di-1}$ to rapidly rise approximately the same amount to a high value $V_{DZi-1}$ considerably greater than $V_{D\overline{n}}$. Value $V_{DZi-1}$ is less than $V_{D\overline{n}}$, the value that cell output voltage $V_{Di}$ momentarily reached just before its rapid transition downward. Capacitor $C_{Ci+1}$ simultaneously causes output voltage $V_{Di+1}$ of next cell $60_{i+1}$ to rapidly rise approximately $V_{DD}-V_{SS}$ to a high value considerably greater than $V_{D\overline{n}}$. Charge-transfer FETs $P_{Ti-1}$ and $P_{Ti+1}$ and first side FETs $P_{Si-1}$, and $P_{Si+1}$ turn off. Second side FETs $P_{Di-1}$ and $P_{Di+1}$ turn on.

With charge-transfer FET $P_{Si}$ turned on while charge-transfer FETs $P_{Ti-1}$ and $P_{Ti+1}$ are turned off, positive charge is transferred from capacitor $C_{Ci-1}$ through FET $P_{Ti}$ to capacitor $C_{Ci}$. This causes cell output voltage $V_{Di}$ to increase relatively gradually and cell input voltage $V_{Di-1}$ to decrease relatively gradually. Output voltage $V_{Di+1}$ from next cell $60_{i+1}$ likewise decreases relatively gradually. Because side FETs $P_{Si}$ and $P_{Di}$ are respectively on and off, body voltage $V_{Bi}$ now equals cell input voltage $V_{Di-1}$. Body voltage $V_{Bi}$ thus rapidly switches from $V_{D\overline{n}}$ down to $V_{DZi-1}$ at time $t_2$.

Cell output voltage $V_{Di}$ momentarily reaches a value $V_{DXi}$ slightly higher than $V_{D\overline{n}}$ at time $t_3$ while cell input voltage $V_{Di-1}$ and body voltage $V_{Bi}$ simultaneously momentarily both reach a value $V_{D\overline{n}-1}$ slightly lower than $V_{DZi-1}$. Value $V_{DXi}$ is less than $V_{D\overline{n}-1}$. Clock voltage $V_{CKP}$ transitions rapidly from $V_{SS}$ up to $V_{DD}$ at time $t_3$ as clock voltage $\overline{V}_{CK\ P}$ makes a rapid opposite transition from $V_{DD}$ down to $V_{SS}$. In response to the $V_{CKP}$ rise of $V_{DD}-V_{SS}$, capacitor $C_{Ci}$ causes cell output voltage $V_{Di}$ to rapidly rise approximately the same amount to $V_{DZi}$. Charge-transfer FET $P_{Ti}$ and first side FET $P_{Si}$ turn back off. Second side FET $P_{Di}$ turns back on.

Complementarily responsive to the $\overline{V}_{CK\ P}$ drop of $V_{DD}-V_{SS}$, capacitor $C_{Ci-1}$ causes cell input voltage $V_{Di-1}$ to rapidly drop approximately the same amount to $V_{D\overline{n}-1}$. As indicated in FIG. 9, value $V_{D\overline{n}-1}$ is considerably less than $V_{DZi}$. Capacitor $C_{Ci+1}$ simultaneously causes output voltage $V_{Di+1}$ of next cell $60_{i+1}$ to rapidly drop approximately $V_{DD}-V_{SS}$ to a low level considerably less than $V_{DZi}$. Charge-transfer FETs $P_{Ti-1}$ and $P_{Ti+1}$ and first side FETs $P_{Si-1}$ and $P_{Si+1}$ turn back on. Second side FETs $P_{Di-1}$ and $P_{Di+1}$ turn back off.

The combination of the $P_{Ti}$ off condition and the $P_{Ti+1}$ on condition enables positive charge to be transferred from capacitor $C_{Ci}$ through charge-transfer FET $P_{Ti+1}$ to capacitor $C_{Ci+1}$. Cell output voltage $V_{Di}$ thereby drops relatively gradually. With charge-transfer FETs $P_{Ti}$ and $P_{Ti-1}$ respectively turned off and on, positive charge is transferred from capacitor $C_{Ci-2}$ through FET $P_{Ti-1}$ to capacitor $C_{Ci-1}$ to raise cell input voltage $V_{Di-1}$ relatively gradually. Output voltage $V_{Di+1}$ of next cell $60_{i+1}$ likewise increases relatively gradually. Since side FETs $P_{Di}$ and $P_{Si}$ are respectively on and off, body voltage $V_{Bi}$ equals cell output voltage $V_{Di}$ at time $t_3$. As a result, body voltage $V_{Bi}$ rapidly switches from $V_{D\overline{n}-1}$ up to $V_{DZi}$.

At time $t_4$, voltages $V_{Di}$, $V_{Di-1}$, and $V_{Bi}$ are respectively at substantially the same values as at time $t_1$. The interval from time $t_1$ to time $t_4$ is thus one cycle, or period, of the charge-pumping operation. The clock frequency is sufficiently great that (a) charge-transfer FET $P_{Ti}$ and first side FET $P_{Si}$ are turned on substantially the entire time that clock voltage $V_{CKP}$ is low and (b) second side FET $P_{Di}$ is turned on substantially the entire time that clock voltage $V_{CKP}$ is high.

Importantly, body voltage $V_{Bi}$ equals cell input voltage $V_{Di-1}$ at the first S/D region (source) of charge-transfer FET $P_{Ti}$ whenever it is turned on. Consequently, each charge-transfer FET $P_{Ti}$ effectively has substantially the same zero back-bias threshold voltage $V_{T0}$ as each other FET $P_{Ti}$. Body voltage $V_{Bi}$ equals cell output voltage $V_{Di}$ whenever FET $P_{Ti}$ is turned off. This prevents body voltage $V_{Bi}$ from electrically floating.

Stage voltage gain $\Delta V_{Di}$ can be defined as the difference between the average value of cell output voltage $V_{Di}$ and the average value of cell input voltage $V_{Di-1}$. As shown in FIG. 9, voltages $V_{Di}$ and $V_{Di-1}$ have substantially identical waveforms displaced in magnitude and displaced in time by half a clock period. Consequently, stage voltage gain $\Delta V_{Di}$ is the difference between voltages $V_{Di}$ and $V_{Di-1}$ at two identical locations, e.g., the maximum voltage points, on the $V_{Di}$ and $V_{Di-1}$ waveforms.

To a first approximation, stage voltage gain $\Delta V_{Di}$ equals $V_{DD} - V_{SS} - |V_{T0}|$. Since zero back-bias threshold voltage $V_{T0}$ is substantially the same for each charge-transfer FET $P_{Ti}$, stage voltage gain $\Delta V_{Di}$ is the same for each pump stage $62_i$. Pump output voltage $V_{PP}$ thus increases linearly as the number n of stages $62_1$-$62_n$ increases. The charge pump of FIG. 7 operates very efficiently.

Figure 1:
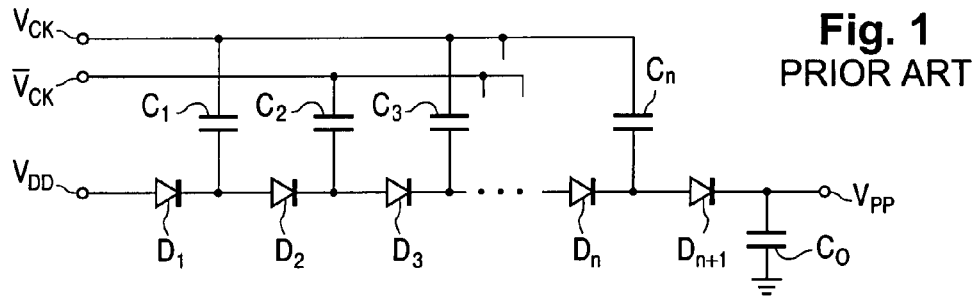
FIGS. 1, 3, and 4 are circuit diagrams of three conventional charge pumps.
Figure 2:
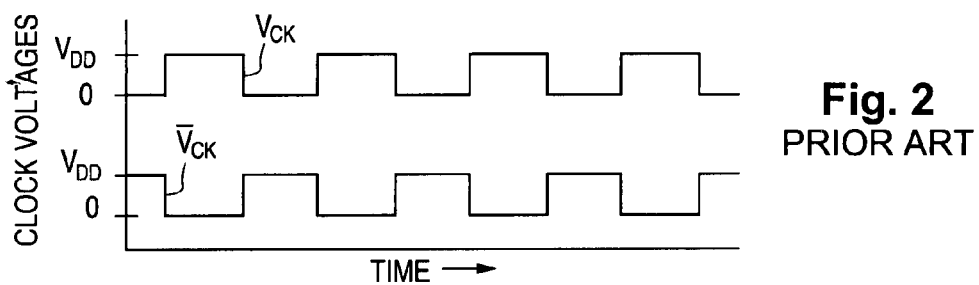
FIG. 2 is a graph of idealized clock voltages for the charge pump of each of FIGS. 1, 3, and 4.
Figure 3:
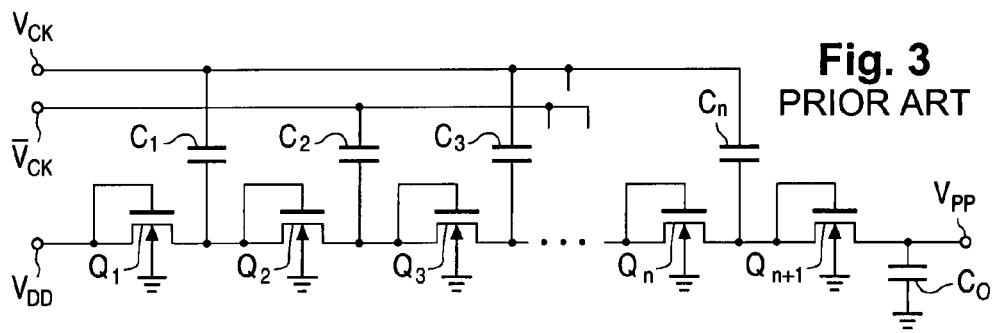
Figure 4:
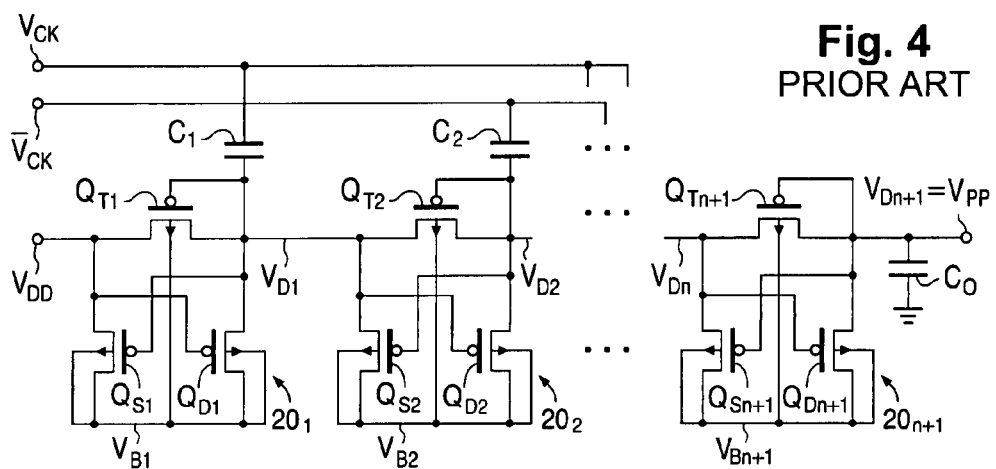
Figure 5:
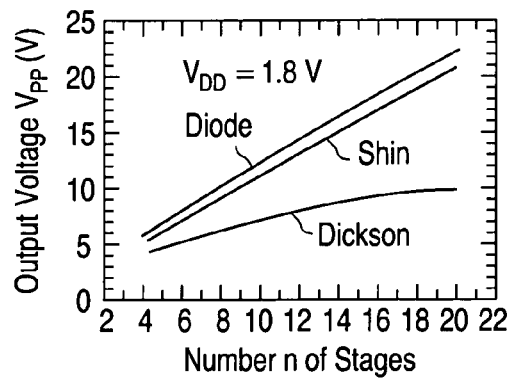
FIG. 5 is a graph of pump output voltage as a function of the number of stages for the charge pumps of FIGS. 1, 3, and 4.
Figure 6A:
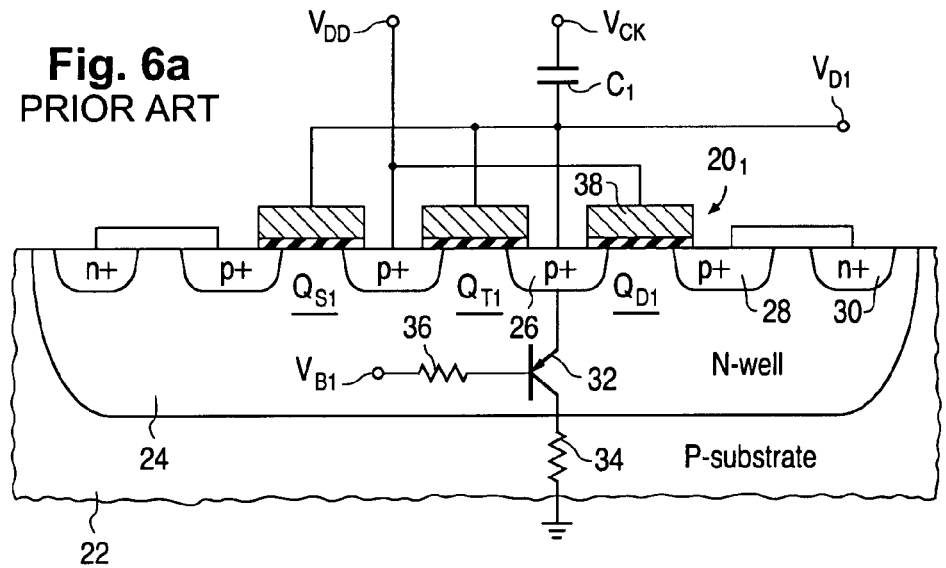
FIGS. 6a and 6b are a pair of composite circuit diagrams/side cross-sectional views for the first and output cells of the charge pump of FIG. 4.

First charge-transfer cell $60_i$ and output charge-transfer cell $60_{n+1}$ avoid bipolar action which can readily occur in corresponding cells $20_{10}$ and $20_{n+1}$ of Shin's charge pump and which can severely degrade the performance of Shin's pump. Analogous to FIG. 6a for first cell $20_1$ of Shin's pump, FIG. 10a cross-sectionally illustrates a typical implementation of first cell $60_1$ for assistance in understanding why it avoids undesired bipolar action. Referring to FIG. 10a, the charge pump of FIG. 7 is created from a lightly doped p-type monocrystalline silicon semiconductor substrate 72. A moderately doped n-type well 74 is provided in p-substrate 72 for first cell 601.

Six heavily doped p-type regions, including p+ regions 76 and 78, are provided in n well 74 along its upper surface and variously serve as the S/D regions for charge-transfer FET PT, and side FETs $P_{S1}$ and $P_{D1}$. P+ region 76 is the $P_{D1}$ first S/D region (source). P+ region 78 is the $P_{D1}$ second S/D region (drain) and is electrically connected to well 74 by way of a heavily doped n-type contact region 80 provided in well 74. P-substrate 72, n well 74, and p+ region 76 respectively serve as the collector, base, and emitter of a parasitic pnp bipolar transistor 82 having parasitic collector resistance 84 and parasitic base resistance 86.

Item 88 in FIG. 10a is the $P_{D1}$ gate electrode. Unlike Shin's charge pump in which gate electrode 38 of drain-side FET $Q_{D1}$ in first cell $20_1$ receives substantially constant high supply voltage $V_{DD}$, gate electrode 88 of second side FET $Q_{D1}$ receives clock voltage $\overline{V}_{CKP}$ in first cell $60_1$ of the charge pump of FIG. 7.

When clock voltage $V_{CKP}$ goes high at time $t_3$ to raise output voltage $V_{D1}$ of cell $60_1$ in the charge pump of FIG. 7 so as to turn off charge-transfer FET $P_{T1}$ and first side FET $P_{S1}$ and to simultaneously turn on second side FET $P_{D1}$, clock voltage $\overline{V}_{CK\,P}$ applied to $P_{D1}$ gate electrode 88 simultaneously goes low rather than remaining at a constant value as occurs with voltage $V_{DD}$ applied to $Q_{D1}$ gate electrode 38 in first cell $20_1$ of Shin's pump. For the same value of power-supply voltage range $V_{DD}$-$V_{SS}$, the voltage difference between gate electrode 88 and first S/D region 76 of second side FET $P_{D1}$ immediately after time $t_3$ in the pump of FIG. 7 is thus considerably greater than the voltage difference between gate electrode 38 and source 26 of drain-side FET $Q_{D1}$ at the corresponding time that clock voltage $V_{CK}$ goes high in Shin's pump.

Even though the voltage difference between gate electrode 88 and first S/D region 76 of second side FET $P_{D1}$ in first cell $60_1$ of the charge pump of FIG. 7 progressively decreases during the interval in which clock voltage $V_{CKP}$ is high due to the gradual reduction in output voltage $V_{D1}$ of cell $60_1$ resulting from the transfer of charge through charge-transfer FET $P_{T2}$ in second cell $60_2$, the minimum value of the voltage difference between gate electrode 88 and first S/D region 76 of FET $P_{D1}$ during the $V_{CKP}$ high interval is considerably greater than the minimum value of the voltage difference between gate electrode 38 and source 26 of drain-side FET $Q_{D1}$ in Shin's charge pump during the interval in which clock voltage $V_{CK}$ is high. This considerably greater minimum voltage difference ensures that second side FET $P_{D1}$ in first cell $60_1$ of the pump of FIG. 7 is turned on strongly during the entire interval that clock voltage $V_{CKP}$ is high.

With the connection of $P_{D1}$ gate electrode 88 to the $V_{CK\,P}$ source ensuring that second side FET $P_{Di}$ is strongly conductive during the entire $V_{CKP}$ high interval, $P_{D1}$ first S/D region 76 is simultaneously electrically connected to n well 74 by way of a highly conductive electrical path through the $P_{D1}$ channel region, $P_{D1}$ second S/D region 78, and n+ contact region 80. This enables body voltage $V_{B1}$ at the base of pnp transistor 82 to substantially equal cell input voltage $V_{D1}$ at its emitter 76. Since the base-to-emitter voltage of transistor 82 is thus substantially zero, transistor 82 is turned off during the entire interval that clock voltage $V_{CKP}$ is high. Transistor 82 does not turn on at any other time, e.g., when clock voltage $V_{CKP}$ is low, during normal pumping operation. Consequently, first cell $60_i$ avoids undesired bipolar action that could degrade its stage voltage gain and performance.

Figure 6B:
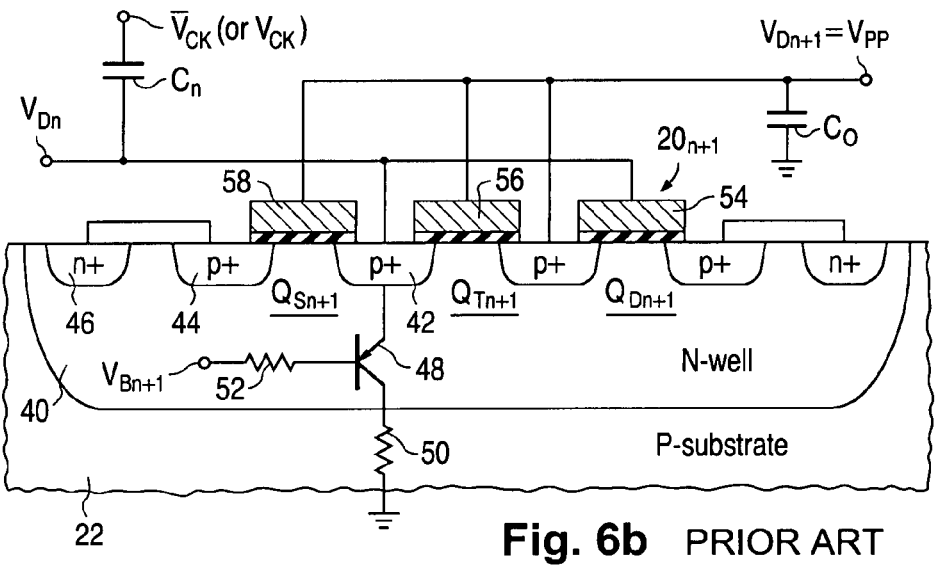

Analogous to FIG. 6b for output cell $20_{n+1}$ of Shin's charge pump, FIG. 10b cross-sectionally illustrates a typical implementation of output cell $60_{n+1}$ for assistance in understanding why it likewise avoids undesired bipolar action. As with FIG. 7a, FIG. 10b illustrates the situation in which n is an even number so that clock voltage $\overline{V}_{CK\,P}$ is provided to capacitor $C_{Cn}$. Referring to FIG. 10b, p-substrate 72 is provided with a further moderately doped n-type well 90 for output cell $60_{n+1}$.

Six heavily doped p-type regions, including p+ regions 92 and 94, are provided in n well 90 along its upper surface to variously serve as the S/D regions for charge-transfer FET $P_{Tn+1}$ and side FETs $P_{Sn+1}$ and $P_{Dn+1}$. P+ region 92 is the $P_{Sn+1}$ first S/D region (source). P+ region 94 is the $P_{Sn+1}$ second S/D region (drain) and is electrically connected to n well 90 by way of a heavily doped n-type contact region 96 provided in well 90 along its upper surface. P-substrate 72, n well 90, and p+ region 92 respectively constitute the collector, base, and emitter of a parasitic pnp bipolar transistor 98 having parasitic collector resistance 100 and parasitic base resistance 102.

Items 104, 106, and 108 in FIG. 10b respectively are the $P_{Dn+1}$, $P_{Tn+1}$ and $P_{Sn+1}$ gate electrodes. Unlike Shin's charge pump in which gate electrode 58 of source-side FET $Q_{Sn+1}$ in output cell $20_{n+1}$ receives largely constant pump output voltage $V_{PP}$, gate electrode 108 of first side FET $P_{Sn+1}$ in output cell $60_{n+1}$ of the charge pump of FIG. 7 is coupled to the $V_{CKP}$ source by way of capacitor $C_{Cn-1}$ or capacitor $C_{Gn+1}$. In either case, the voltage at $P_{Sn+1}$ gate electrode 108 varies with clock voltage $V_{CKP}$. When clock voltage $\overline{V}_{CK\,P}$ goes high at time $t_2$ to raise input voltage $V_{Dn}$ to output cell $60_{n+1}$ in the charge pump of FIG. 7 so as to turn off second side FET $P_{Dn+1}$ and to simultaneously turn on charge-transfer FET $P_{Tn+1}$ and first side FET $P_{Sn+1}$, clock voltage $V_{CKP}$ goes low to reduce the voltage at $P_{Sn+1}$ gate electrode 108 instead of remaining approximately constant as occurs with pump output voltage $V_{PP}$ applied to $Q_{Sn+1}$ gate electrode 58 in output cell $20_{n+1}$ of Shin's pump. For the same value of power-supply voltage range $V_{DD}$-$V_{SS}$, the voltage difference between gate electrode 108 and first S/D region 92 of first side FET $P_{Sn+1}$ immediately after time $t_2$ in the pump of FIG. 7 is thus considerably greater than the voltage difference between gate electrode 58 and source 42 of source-side FET $Q_{Sn+1}$ at the corresponding time in Shin's pump.

Although the voltage difference between gate electrode 108 and first S/D region 92 of FET $P_{Sn+1}$ in output cell $60_{n+1}$ of the charge pump of FIG. 7 progressively decreases during the interval in which clock voltage $\overline{V}_{CK\,P}$ is high due to the gradual reduction in input voltage $V_{Dn}$ of cell $60_{n+1}$ resulting from the transfer of charge through charge-transfer FET $P_{Tn+1}$, the minimum value of the voltage difference between gate electrode 108 and first S/D region 92 of FET $P_{Sn+1}$ during the $\overline{V}_{CK\,P}$ high interval is considerably greater than the minimum value of the voltage difference between gate electrode 58 and source 42 of source-side FET $Q_{Sn+1}$ during the corresponding interval in Shin's charge pump. Due to this increased minimum gate-to-source voltage difference, first side FET $P_{Sn+1}$ in output cell $60_{n+1}$ of the pump of FIG. 7 stays on strongly during the entire interval that clock voltage $\overline{V}_{CK\,P}$ is high.

With the coupling of $P_{Sn+1}$ gate electrode 108 to the $V_{CKP}$ source by way of capacitor $C_{Cn-1}$ or $C_{Gn+1}$ ensuring that first side FET $P_{Sn+1}$ in output cell $60_{n+1}$ of the charge pump of FIG. 7 is strongly conductive during the entire $\overline{V}_{CK\,P}$ high interval, $P_{Sn+1}$ first S/D region 92 is simultaneously electrically connected to n well 90 by way of a highly conductive electrical path through the $P_{Sn+1}$ channel region, $P_{Sn+1}$ second S/D region 94, and n+ contact region 96. This enables body voltage $V_{Bn+1}$ at the base of pnp transistor 98 to substantially equal cell input voltage $V_{Dn}$ at its emitter 92. Since the base-to-emitter voltage of parasitic transistor 98 is therefore substantially zero, transistor 98 is turned off during the entire interval that clock voltage $\overline{V}_{CKP}$ is high. Transistor 98 does not turn on at any other time, e.g., when clock voltage $\overline{V}_{CK\,P}$ is low, during normal pumping operation. Hence, output cell $60_{n+1}$ avoids undesired bipolar action that could otherwise substantially degrade the overall charge-pump voltage gain.

Figure 11:
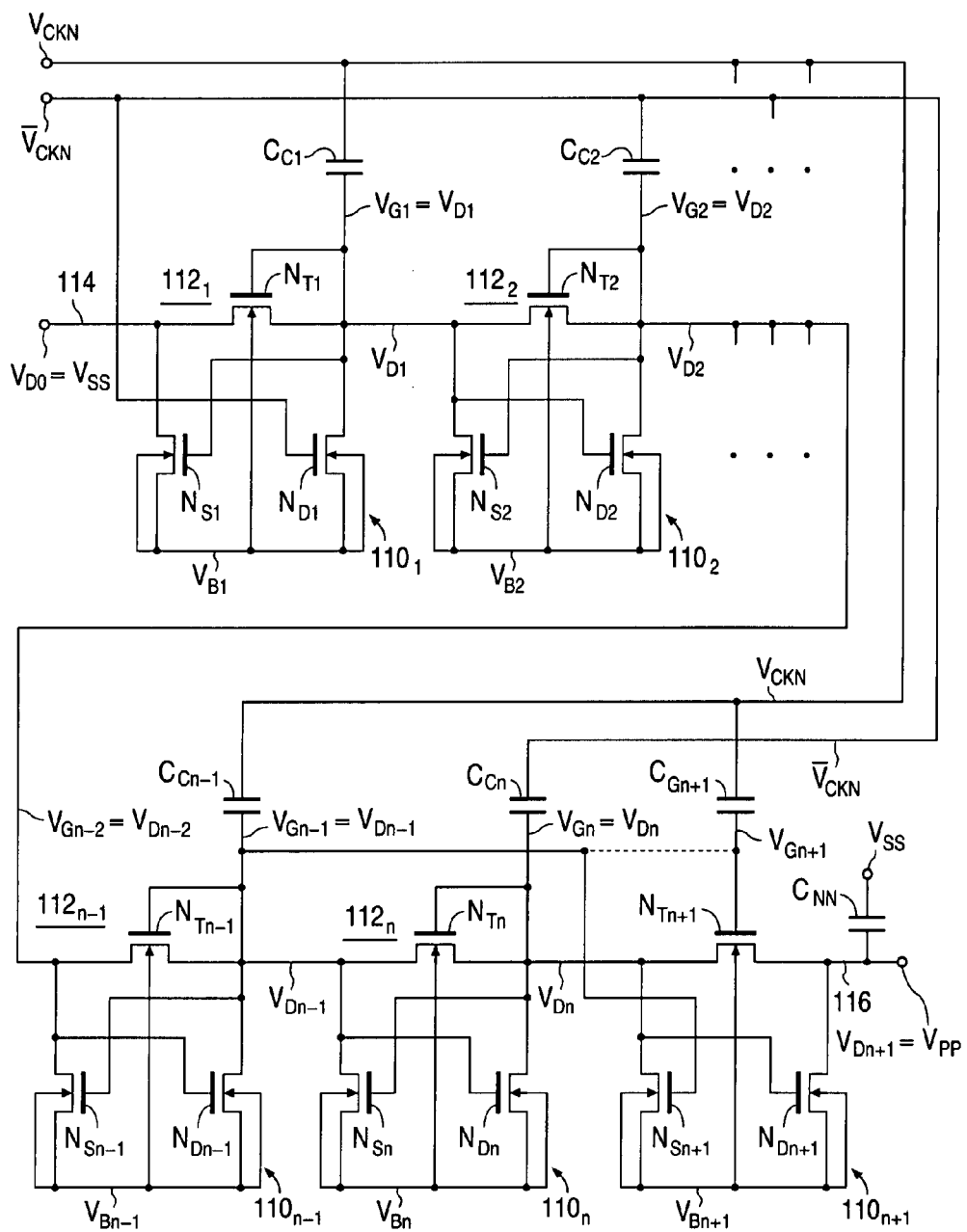
FIG. 11 is a circuit diagram of a two-phase negative charge pump according to the invention.

FIG. 11 illustrates an n-stage two-phase negative charge pump in accordance with the invention. Operating from a power supply that furnishes supply voltages $V_{DD}$ and $V_{SS}$, the charge pump of FIG. 11 consists of n+1 charge-transfer cells $110_1$, $110_2$, . . . $110_{n-1}$, $110_n$, and $110_{n+1}$ arranged in series, primary pump capacitive elements $C_{C1}$-$C_{Cn}$ respectively corresponding to charge-transfer cells $110_1$-$110_n$, additional capacitive element $C_{Gn+1}$, an output capacitive element $C_{NN}$, and sources (not separately shown) of a first clock voltage signal $V_{CKN}$ and a second clock voltage signal $\overline{V}_{CK\,N}$ largely inverse to first clock voltage $V_{CKN}$. Integer n is again at least 3. Each charge-transfer cell $110_i$ and corresponding primary capacitor $C_{Ci}$ form a stage $112_i$ of the charge pump where i here varies from 1 to n.

Pump input voltage $V_{D0}$ at a value largely equal to low supply voltage $V_{SS}$ is provided on an input electrical conductor 114 to first cell $110_1$ in first stage $112_1$. Similar to the charge pump of FIG. 7, nth stage $112_n$ that contains nth cell $110_n$ is the last stage while (n+1)th cell $110_{n+1}$ is an output cell connected to an output electrical conductor 116 on which a pump output voltage signal $V_{NN}$ is supplied at an approximately constant value less than $V_{SS}$. Output capacitor $C_{NN}$ is connected between output conductor 116 and the $V_{SS}$ supply for reducing ripple in pump output voltage $V_{NN}$.

Charge-transfer cells $110_1$-$110_{n+}$, are formed with enhancement-mode n-channel insulated-gate FETs configured as described above for the p-channel FETs in the charge pump of FIG. 7 except that the conductivity types are reversed. Each cell $110_i$ for i varying from 1 to n+1 consists of a charge-transfer FET $N_{Ti}$, a first side FET $N_{Si}$, and a second side FET $N_{Di}$ respectively corresponding to charge-transfer FET $P_{Ti}$, first side FET $P_{Si}$, and second side FET $P_{Di}$ of each cell $60_i$ in the pump of FIG. 7. Charge-transfer FETs $N_{T1}$-$N_{Tn+1}$ are substantially identical. First side FETs $N_{S1}$-$N_{Sn+1}$ are substantially identical. Second side FETs $N_{D1}$-$N_{Dn+1}$ are substantially identical.

FETs $N_{T1}$-$N_{Tn+1}$, $N_{S1}$-$N_{Sn+1}$, and $N_{D1}$-$N_{Dn+1}$ are interconnected with one another and with capacitors $C_{C1}$-$C_{Cn}$ and $C_{Gn+1}$ in the same manner as described above for corresponding FETs $P_{T1}$-$P_{Tn+1}$, $P_{S1}$-$P_{Sn+1}$, and $P_{D1}$-$P_{Dn+1}$ in the charge pump of FIG. 7. Cell output voltages $V_{D1}$-$V_{Dn+1}$, gate voltages $V_{G1}$-$V_{Gn+1}$, and body voltages $V_{B1}$-$V_{Bn+1}$ are present at the same respective locations on FETs $N_{T1}$-$N_{Tn+1}$, $N_{S1}$-$N_{Sn+1}$, and $N_{D1}$-$N_{Dn+1}$ as on FETs $P_{T1}$-$P_{Tn+1}$, $P_{S1}$-$P_{Sn+1}$, and $P_{D1}$-$P_{Dn+1}$. The $V_{CKN}$ and $\overline{V}_{CK\,N}$ sources are connected to capacitors $C_{C1}$-$C_{Cn}$ and $C_{Gn+1}$ in the same respective ways as the $V_{CKP}$ and $\overline{V}_{CK\,P}$ sources.

The connection of the gate electrode of second side FET $N_{D1}$ in first cell $110_1$ differs, in accordance with the invention, from the connection of the gate electrode of second side FET $N_{Di}$ in each other cell $110_i$ in the same manner that the connection of the $P_{Di}$ gate electrode differs from the connection for each other $P_{Di}$ gate electrode in the charge pump of FIG. 7. That is, the $N_{D1}$ gate electrode is connected to the $\overline{V}_{CK\,N}$ source. The connection of the gate electrode of first side FET $N_{Sn+1}$ in output cell $110_{n+1}$ likewise differs, in accordance with the invention, from the connection of the gate electrode of first side FET $N_{Si}$ in each other cell $110_i$ in the same manner that the connection of the $P_{Sn+1}$ gate electrode differs from the connection of each other $P_{Si}$ gate electrode in the pump of FIG. 7. Hence, the $N_{Sn+1}$ gate electrode is typically connected to the second S/D region of charge-transfer FET $N_{Tn-1}$ in cell $110_{n-1}$ to receive output voltage $V_{Dn-1}$ from cell $110_{n-1}$ but can alternatively be connected to the gate electrode of charge-transfer FET $N_{Tn+1}$ in cell $110_{n+1}$ to receive gate voltage $V_{Gn+1}$.

Subject to reversing all the voltage polarities, the charge pump of FIG. 11 operates in the same manner as the charge pump of FIG. 7. Consequently, the pump of FIG. 11 avoids undesired bipolar action in first charge-transfer cell $110_1$ and output charge-transfer cell $110_{n+1}$ in the same way that undesired bipolar action is avoided in corresponding cells $60_1$ and $60_{n+1}$ of the pump of FIG. 7.

Figure 12A:
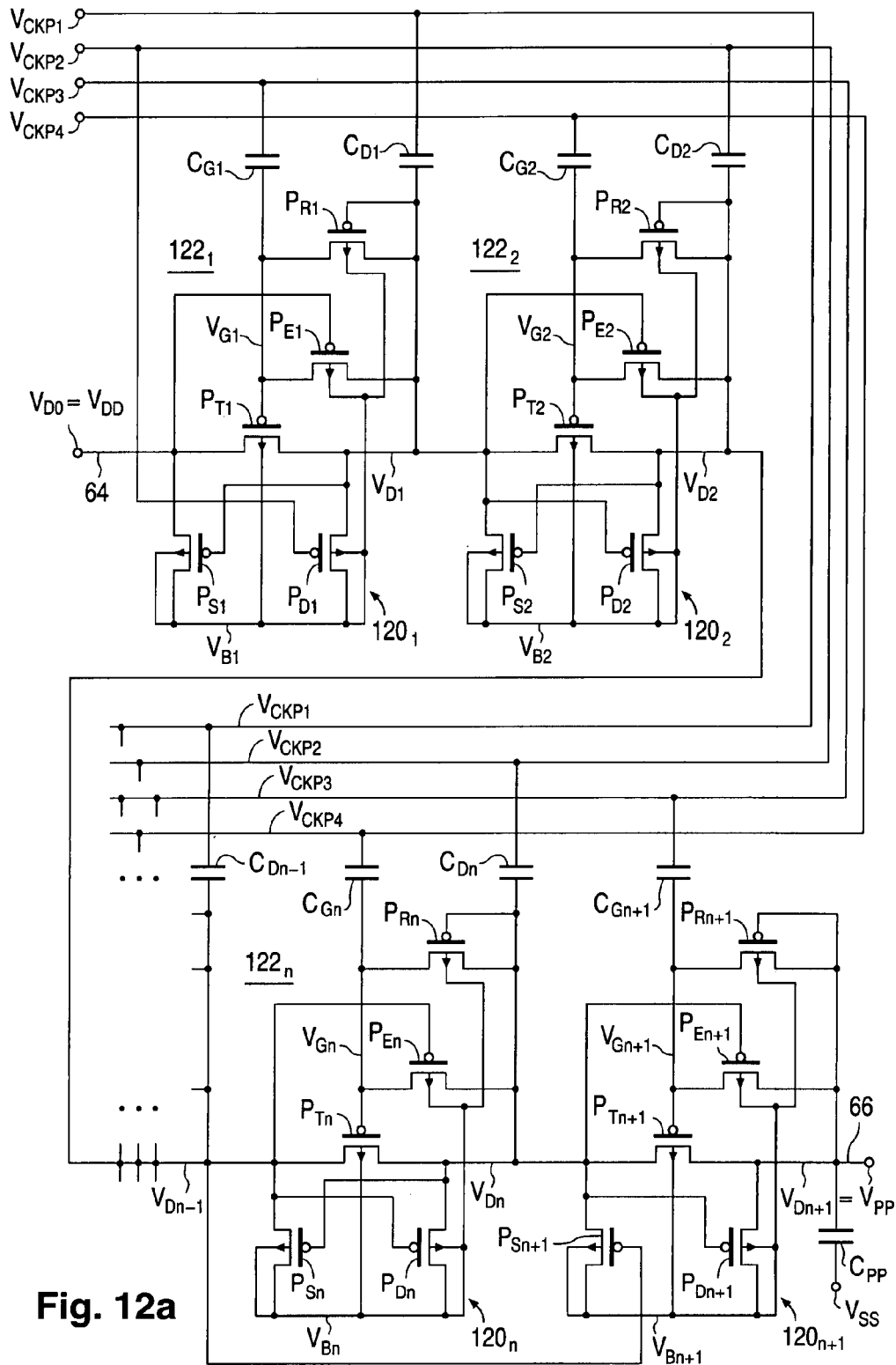
FIGS. 12a and 12b are circuit diagrams of a four-phase positive charge pump according to the invention.
Figure 12B:
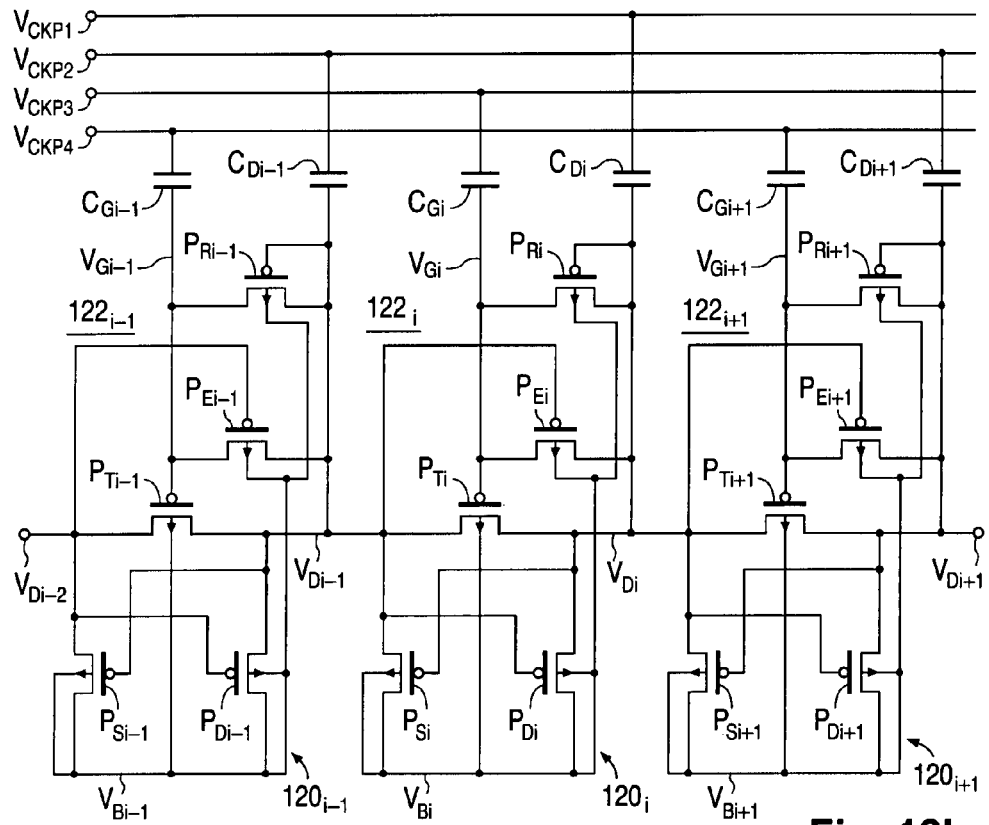

FIGS. 12a and 12b (collectively "FIG. 12") illustrate an extension of the two-phase charge pump of FIG. 7 to an n-stage four-phase positive charge pump in accordance with the invention for achieving further improved performance. Beginning and end portions of the four-phase positive charge pump are depicted in FIG. 12a. An intermediate pump portion is depicted in FIG. 12b. As in the pump of FIG. 7, the charge pump of FIG. 12 operates from power supplies that provide high supply voltage $V_{DD}$ and low supply voltage $V_{SS}$.

The charge pump of FIG. 12 consists of n+1 charge-transfer cells $120_1$, $120_2$, . . . $120_{n-1}$, $120_n$, and $120_{n+1}$ arranged in series, n primary pump capacitive elements $C_{D1}$, $C_{D2}$, ... $C_{Dn-1}$, and $C_{Dn}$ respectively corresponding to charge-transfer cells $120_1$-$120_n$, n further pump capacitive elements $C_{G1}$, ... $C_{Gn-1}$, and $C_{Gn}$ similarly respectively corresponding to cells $120_1$-$120_n$, further (or additional) capacitive element $C_{Gn+1}$ for cell $120_{n+1}$, output capacitive element $C_{PP}$, and sources (not separately shown) of a first clock voltage signal $V_{CKP1}$, a second clock voltage signal $V_{CKP2}$ largely inverse to first clock voltage $V_{CKP1}$, a third clock voltage signal $V_{CKP3}$ partially in phase with first clock voltage $V_{CKP1}$, and a fourth clock voltage signal $V_{CKP4}$ partially in phase with second clock voltage $V_{CKP2}$. Each charge-transfer cell $120_i$, primary capacitor $C_{Di}$, and further capacitor $C_{Gi}$ form a stage $122_i$ of the charge pump where i varies from 1 to n.

Each charge-transfer cell $120_i$ consists of charge-transfer FET $P_{Ti}$, first side FET $P_{Si}$, second side FET $P_{Di}$, a voltage-equalization FET $P_{Ei}$, and a diode-configured FET $P_{Ri}$ where i varies from 1 to n+1. As with FETs $P_{Ti}$, $P_{Si}$, and $P_{Di}$, FETs $P_{Ei}$ and $P_{Ri}$ are enhancement-mode p-channel insulated-gate devices. Voltage-equalization FETs $P_{E1}$-$P_{En+1}$ are substantially identical. Diode-configured FETs $P_{R1}$-$P_{Rn+1}$ are substantially identical.

The connections of FETs $P_{T1}$-$P_{Tn+1}$, $P_{S1}$-$P_{Sn+1}$, and $P_{D1}$-$P_{Dn+1}$ are, except as described below, the same in the charge pump of FIG. 12 as in the charge pump of FIG. 7. Different from charge-transfer FET $P_{Ti}$ in cell $60_i$ of each stage $62_i$ in the pump of FIG. 7, the gate electrode of FET $P_{Ti}$ in cell $120_i$ of each pump stage $122_i$ for i now varying from 1 to n is not connected directly to the $P_{Ti}$ second S/D region. Instead, the second S/D region and gate electrode of charge-transfer FET $P_{Ti}$ are respectively connected to the first and second S/D regions (respectively source and drain) of voltage-equalization FET $P_{Ei}$ whose gate electrode is connected to the $P_{Ti}$ first S/D region. This applies to integer i varying from 1 to n and to integer i equal to n+1, i.e., to stage cells $120_1$-$120_n$ and to output cell $120_{n+1}$.

Also, the $P_{Ti}$ gate electrode is connected to the first S/D region (source) of diode-configured FET $P_{Ri}$. The $P_{Ti}$ second S/D region is connected to the gate electrode and second S/D region (drain) of FET $P_{Ri}$ so that FET $P_{Ri}$ is in a diode configuration. Each diode-configured FET $P_{Ri}$ is thus a rectifier. The body regions of FETs $P_{Ei}$ and $P_{Ri}$ are commonly connected to the interconnected second S/D regions of FETs $P_{Si}$ and $P_{Ei}$ to receive body voltage $V_{Bi}$. The connections made with FETs $P_{Ei}$ and $P_{Ri}$ apply to integer i varying from 1 to n+1, i.e., to output cell $120_{n+1}$ as well as each of stage cells $120_1$-$120_n$.

Each charge-transfer FET $P_{Ti}$ except for FET $P_{Tn+1}$ has the following additional connections in the charge pump of FIG. 12. Especially see FIG. 12b. For each odd value of i different from n+1, primary capacitor $C_{Di}$ is connected between the $P_{Ti}$ second S/D region and the $V_{CKP1}$ source while further capacitor $C_{Gi}$ is connected between the $P_{Ti}$ gate electrode and the $V_{CKP3}$ source. For each even value of i different from n+1, primary capacitor $C_{Di}$ is connected between the $P_{Ti}$ second S/D region and the $V_{CKP2}$ source while further capacitor $C_{Gi}$ is connected between the $P_{Ti}$ gate electrode and the $V_{CKP4}$ source. Since the gate electrode and second S/D region of each FET $P_{Ti}$ are not directly connected together, gate voltage $V_{Gi}$ and cell output voltage $V_{Di}$ of cell $120_i$ in each stage $122_i$ are separate signals.

With respect to charge-transfer FET $P_{Tn+1}$ in output cell $120_{n+1}$, further capacitor $C_{Gn+1}$ is connected between the $P_{Tn+1}$ gate electrode and (i) the $V_{CKP3}$ source if n is an even number or (ii) the $V_{CKP4}$ source if n is an odd number. Note that this connection for capacitor $C_{Gn+1}$ differs from that of the charge pump of FIG. 7. FIG. 12a illustrates the example in which n is even. Gate voltage $V_{Gn+1}$ and pump output voltage $V_{PP}$ (or $V_{Dn+1}$) are again separate signals.

The gate electrode of second side FET $P_{D1}$ in first cell $120_1$ is connected to the $V_{CKP2}$ source to receive clock voltage $V_{CKP2}$. Analogous to the first-mentioned embodiment of the charge pump of FIG. 7, the gate electrode of first side FET $P_{Sn+1}$ in output cell $120_{n+1}$ is connected to the second S/D region of charge-transfer FET $P_{Tn-1}$ in cell $120_{n-1}$ (two cells earlier) to receive output voltage $V_{Dn-1}$ from cell $120_{n-1}$. The remaining transistor/capacitor connections in the charge pump of FIG. 12 are the same as in the pump of FIG. 7.

Figure 13:
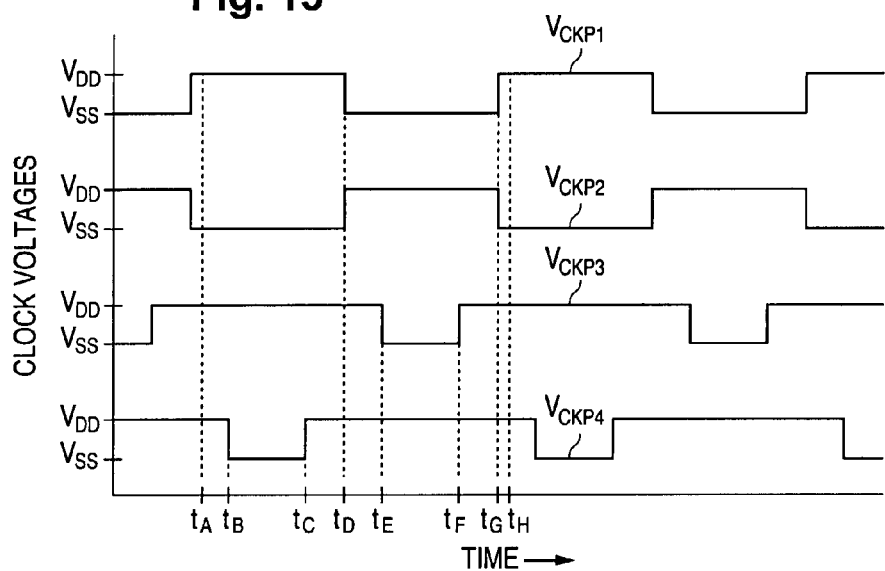
FIG. 13 is a graph of idealized clock voltages for the charge pump of FIGS. 12a and 12b.

Clock voltages $V_{CKP1}$-$V_{CKP4}$ vary in a periodic manner between low supply voltage $V_{SS}$ and a high voltage equal, or very close, to high supply voltage $V_{DD}$. FIG. 13 presents idealized waveforms for the time variations of clock voltages $V_{CKP1}$-$V_{CKP4}$ between $V_{SS}$ and $V_{DD}$. In light of how clock voltages $V_{CKP1}$ and $V_{CKP2}$ are applied to capacitors $C_{D1}$-$C_{Dn}$, voltages $V_{CKP1}$ and $V_{CKP2}$ basically respectively correspond to clock voltages $V_{CKP}$ and $\nabla_{CK\,P}$ utilized in the charge pump of FIG. 7.

Clock voltages $V_{CKP1}$ and $V_{CKP3}$ form a clock-signal pair employed mainly in controlling odd-numbered pump stages $122_1$, $122_3$, and so on. In FIG. 12b, the pump stage labeled "$122_i$" is such an odd-numbered stage. Clock voltages $V_{CKP2}$ and $V_{CKP4}$ form a clock-signal pair employed in controlling even-numbered pump stages $122_2$, $122_4$, and so on. The pump stages labeled "$122_{i-1}$" and "$122_{i+1}$" in FIG. 12b are even-numbered stages.

As indicated in FIG. 13, clock voltage $V_{CKP3}$ is at $V_{SS}$ during pumping operation only when clock voltage $V_{CKP1}$ is at $V_{SS}$ and, in particular, during only part of each time interval that voltage $V_{CKP1}$ is at $V_{SS}$. Similarly, clock voltage $V_{CKP4}$ is at $V_{SS}$ during pumping operation only when clock voltage $V_{CKP2}$ is at $V_{SS}$ and, in particular, during only part of each time interval that voltage $V_{CKP2}$ is at $V_{SS}$. In complementary fashion, clock voltage $V_{CKP1}$ is at $V_{DD}$ during pumping operation only during part of each time interval that clock voltage $V_{CKP3}$ is at $V_{DD}$. Clock voltage $V_{CKP2}$ is similarly at $V_{DD}$ during pumping operation only during part of each time interval that clock voltage $V_{CKP4}$ is at $V_{DD}$.

More particularly, clock voltage $V_{CKP1}$ makes a high-to-low transition followed sequentially by a high-to-low $V_{CKP3}$ transition, a low-to-high $V_{CKP3}$ transition, and a low-to-high $V_{CKP1}$ transition. Clock voltage $V_{CKP3}$ thus transitions from $V_{DD}$ to $V_{SS}$ and back to $V_{DD}$ between (a) when clock voltage $V_{CKP1}$ transitions from $V_{DD}$ to $V_{SS}$ and (b) when voltage $V_{CKP1}$ immediately thereafter transitions back to $V_{DD}$. Similarly, clock voltage $V_{CKP2}$ makes a high-to-low transition followed sequentially by a high-to-low $V_{CKP4}$ transition, a low-to-high $V_{CKP4}$ transition, and a low-to-high $V_{CKP2}$ transition. Accordingly, clock voltage $V_{CKP4}$ transitions from $V_{DD}$ to $V_{SS}$ and back to $V_{DD}$ between (a) when clock voltage $V_{CKP2}$ transitions from $V_{DD}$ to $V_{SS}$ and (b) when voltage $V_{CKP2}$ immediately thereafter transitions back to $V_{DD}$.

Utilizing the clock waveforms of FIG. 13 and with the voltage waveforms of FIG. 9 and the associated comments about the charge pump of FIG. 7 in mind, each pump stage $122_i$ for i varying from 1 to n operates as follows in generating its stage voltage gain $\Delta V_{Di}$. Clock voltages $V_{CKP1}$ and $V_{CKP2}$ control first side FETs $P_{S1}$-$P_{Sn}$ and second side FETs $P_{D2}$-$P_{Dn+1}$ through capacitors $C_{D1}$-$C_{Dn}$ in basically the same manner that clock voltages $V_{CKP}$ and $\nabla_{CK\,P}$ control FETs $P_{S1}$-$P_{Sn}$ and $P_{D2}$-$P_{Dn+1}$ through capacitors $C_{C1}$-$C_{Cn}$ in the pump of FIG. 7.

Consider the example of FIG. 12b in which pump stage $122_i$ is an odd-numbered stage whose primary capacitor $C_{Di}$ is connected to the source of clock voltage $V_{CKP1}$ corresponding to clock voltage $V_{CKP}$ in the pump of FIG. 7. First side FET $P_{Si}$ and second side FET $P_{Di}$ in cell $120_i$ of that stage $122_i$ are respectively turned off and on when clock voltage $V_{CKP1}$ is high. Body voltage $V_{Bi}$ thereby equals cell output voltage $V_{Di}$ during $V_{CKP1}$ high intervals. This prevents body voltage $V_{Bi}$ from electrically floating during times intervals in which side FETs $P_{Si}$ and $P_{Di}$ are respectively off and on. Undesired bipolar action is thus avoided during such time intervals.

When clock voltage $V_{CKP1}$ is low, first side FET $P_{Si}$ and second side FET $P_{Di}$ in cell $120_i$ of pump stage $122_i$ in FIG. 12b are respectively turned on and off so that body voltage $V_{Bi}$ equals cell input voltage $V_{Di-1}$. Charge-transfer FET $P_{Ti}$ in each stage $122_i$ (regardless of whether it is an odd-numbered or even-numbered stage) is turned on substantially only when that stage's first side FET $P_{Si}$ is turned on. Body voltage $V_{Bi}$ in each stage $122_i$ therefore equals voltage $V_{Di-1}$ at the first S/D region of that stage's charge-transfer FET $P_{Ti}$ when it is turned on. This enables each charge-transfer FET $P_{Ti}$ to have largely the same zero back-bias threshold voltage $V_{T0}$ as each other FET $P_{Ti}$.

Cell input voltage $V_{Di-1}$ to cell $120_i$ of each stage $122_i$ exceeds cell output voltage $V_{Di}$ when that stage's first side FET $P_{Si}$ is turned on. As discussed below, charge-transfer FET $P_{Ti}$ in each stage $122_i$ is actually turned on only during part of each time interval in which that stage's first side FET Psi is turned on. Inasmuch as body voltage $V_{Bi}$ of each cell $120_i$ in each stage $122_i$ equals cell input voltage $V_{Di-1}$ during each interval in which first side FET $P_{Si}$ is turned on and thus during each interval portion in which first side FET $P_{Si}$ is turned on but charge-transfer FET $P_{Ti}$ is turned off, body voltage $V_{Bi}$ in each stage $122_i$ is prevented from reaching a voltage level that could cause undesired bipolar action during each interval portion in which FET $P_{Si}$ is turned on but FET $P_{Ti}$ is turned off.

The connection of the $P_{D1}$ gate electrode to the $V_{CKP2}$ source, corresponding to connection of the $P_{D1}$ gate electrode to the $\bar{V}_{CK\_P}$ source in the charge pump of FIG. 7, avoids undesired bipolar action in first charge-transfer cell $120_1$ of the charge pump of FIG. 12 for the reasons, presented above in connection with FIG. 10a, that undesired bipolar action is avoided in first charge-transfer cell $60_1$ of the pump of FIG. 7 subject to changing complementary clock voltages $V_{CKP}$ and $\bar{V}_{CK\_P}$ respectively to complementary clock voltages $V_{CKP1}$ and $V_{CKP2}$ in the explanation of FIG. 10a. The connection of the $P_{Sn+1}$ gate electrode to the $P_{Tn-1}$ second S/D region coupled through capacitor $C_{Dn-1}$ to the $V_{CKP1}$ source, corresponding to the connection of the $P_{Sn+1}$ gate electrode to the $P_{Tn-1}$ second S/D region coupled through capacitor $C_{Cn-1}$ to the $V_{CKP}$ source in the pump of FIG. 7, avoids undesired bipolar action in output charge-transfer cell $120_{n+1}$ of the pump of FIG. 12 for the reasons, presented above in connection with FIG. 10b, that undesired bipolar action is avoided in output charge-transfer cell $60_{n+1}$ of the pump of FIG. 7 for the situation in which the $P_{Sn+1}$ gate electrode is thereby coupled through capacitor $C_{Cn-1}$ to the $V_{CKP}$ source subject to changing voltages $V_{CKP}$ and $\bar{V}_{CK\_P}$ respectively to voltages $V_{CKP1}$ and $V_{CKP2}$ in the explanation of FIG. 10b and also subject to changing capacitor $C_{Cn-1}$ to capacitor $C_{Dn-1}$ in that explanation The pump of FIG. 12 thereby undesired bipolar action during the entire pumping operation.

Returning again to the example of FIG. 12b in which illustrated stage 120 is an odd-numbered stage whose capacitors $C_{Di}$ and $C_{Gi}$ respectively receive clock voltages $V_{CKP1}$ and $V_{CKP3}$, charge-transfer FET $P_{Ti}$ is turned off substantially only when first side FET $P_{Si}$ is turned off because voltage $V_{CKP1}$ is high when voltage $V_{CKP3}$ is high. More particularly, charge-transfer FET $P_{Ti}$ is turned off during only part of each interval in which first side FET $P_{Si}$ is turned off because clock voltage $V_{CKP1}$ is high during only part of each interval that clock voltage $V_{CKP3}$ is high. See FIG. 13 in which times $t_A$, $t_B$, $t_C$, $t_D$, $t_E$, $t_F$, $t_G$ and $t_H$ occur progressively later.

With reference to FIGS. 12b and 13, consider the situation at time $t_A$ when clock voltage $V_{CKP4}$ is high shortly after clock voltage $V_{CKP1}$ goes high so that clock $V_{CKP3}$ is also high. Even though clock voltage $V_{CKP2}$ is low at time $t_A$, charge-transfer FETs $P_{Ti-1}$ and $P_{Ti+1}$ are off because clock voltage $V_{CKP4}$ is high. With charge-transfer FET $P_{Ti}$ and first side FET $P_{Si}$ also being off because respective clock voltages $V_{CKP3}$ and $V_{CKP1}$ are high at time $t_A$, cell input voltage $V_{Di-1}$ at the $P_{Ei}$ gate electrode is sufficiently less than cell output voltage $V_{Di}$ at the $P_{Ei}$ first S/D region (source) that voltage-equalization FET $P_{Ei}$ is turned on. Second side FET $P_{Di}$ is turned on. Body voltage $V_{Bi}$ thus equals cell output voltage $V_{Di}$ at time $t_A$.

Gate voltage $V_{Gi}$ at the $P_{Ri}$ first S/D region (source) is less than cell output voltage $V_{D1}$ at the interconnected gate electrode and second S/D region (drain) of diode-configured FET $P_{Ri}$ at time $t_A$. Consequently FET $P_{Ri}$ is turned off. Since gate voltage $V_{Gi}$ is also present at the $P_{Ei}$ second S/D region (drain), positive charge is transferred from the lower plate of capacitor $C_{Di}$ through voltage-equalization FET $P_{Ei}$ to the lower plate of capacitor $C_{Gi}$ to reduce the voltage difference between voltages $V_{Gi}$ and $V_{Di}$. Gate voltage $V_{Gi}$ preferably becomes largely equal to cell output voltage $V_{Di}$ before clock voltage $V_{CKP1}$ later goes low. In other words, voltage-equalization FET $P_{Ei}$ reduces the difference between, and preferably substantially equalizes, the voltages at the gate electrode and second S/D region of charge-transfer FET $P_{Ti}$ when it is turned off.

Clock voltage $V_{CKP4}$ transitions low at time $t_B$ when clock voltages $V_{CKP1}$ and $V_{CKP3}$ are both still high. Charge-transfer FETs $P_{Ti-1}$ and $P_{Ti+1}$ both turn on. Charge-transfer FET $P_{Ti}$ and first side FET $P_{Si}$ remain off. Second side FET $P_{Di}$ remains on.

With clock voltage $V_{CKP2}$ being low at time $t_B$, positive charge is transferred through charge-transfer FET $P_{Ti-1}$ to capacitor $C_{Di-1}$ to raise cell input voltage $V_{Di-1}$ somewhat as voltage $V_{Di-2}$ drops in a corresponding manner. Body voltage $V_{Bi}$ continues to equal cell output voltage $V_{Di}$. Positive charge is also transferred from capacitor $C_{Di}$ through charge-transfer FET $P_{Ti+1}$ to reduce cell output voltage $V_{Di}$ somewhat as voltage $V_{Di+1}$ similarly rises somewhat. This causes body voltage $V_{Bi}$ to drop relatively gradually. Although voltages $V_{Di-1}$ and $V_{D1}$ approach each other, cell input voltage $V_{Di-1}$ continues to be sufficiently below cell output voltage $V_{Di}$ that voltage-equalization FET $P_{Ei}$ remains on while diode-configured FET $P_{Ri}$ remains off. If voltage-equalization FET $P_{Ei}$ has not yet equalized gate voltage $V_{Gi}$ and cell output voltage $V_{Di}$, FET $P_{Ei}$ continues to reduce the voltage difference between voltage $V_{Gi}$ and then lower voltage $V_{Di}$.

At time $t_C$, clock voltage $V_{CKP4}$ goes back high while clock voltages $V_{CKP1}$ and $V_{CKP3}$ are again still both high. Charge-transfer FETs $P_{Ti-1}$ and $P_{Ti+1}$ turn back off. Charge-transfer FET $P_{Ti}$ and diode-configured FET $P_{Ri}$ remain off. Voltage-equalization FET $P_{Ei}$ remains on and continues, as necessary, to reduce the difference between gate voltage $V_{Gi}$ and cell output voltage $V_{Di}$. Side FETs $P_{Si}$ and $P_{Di}$ respectively remain off and on.

Clock voltage $V_{CKP1}$ goes low at time $t_D$ as clock voltage $V_{CKP2}$ simultaneously goes high. Cell output voltage $V_{Di}$ rapidly drops approximately $V_{DD}$–$V_{SS}$. Cell input voltage $V_{Di-1}$ rapidly rises approximately $V_{DD}$–$V_{SS}$ as does voltage $V_{Di+1}$. First side FET $P_{Si}$ turns on as second side FET $P_{Di}$ turns off. Body voltage $V_{Bi}$ rapidly drops and becomes equal to cell input voltage $V_{Di-1}$.

Charge-transfer FET $P_{Ti}$ remains off because clock voltage $V_{CKP3}$ is still high at time $t_D$. Charge-transfer FETs $P_{Ti-1}$ and $P_{Ti+1}$ likewise remain off. With voltage-equalization FET $P_{Ei}$ having brought voltages $V_{Gi}$ and $V_{D1}$ quite close to each other prior to time $t_D$, the $V_{CKP1}$ and $V_{CKP2}$ transitions at time $t_D$ cause cell input voltage $V_{Di-1}$ at the $P_{Ei}$ gate electrode to exceed cell output voltage $V_{Di}$ at the $P_{Ei}$ first S/D region (source). Voltage-equalization FET $P_{Ei}$ therefore turns off.

The $V_{CKP1}$ transition at time $t_D$ also causes cell output voltage $V_{Di}$ at the $P_{Ri}$ gate electrode to drop below gate voltage $V_{Gi}$ at the $P_{Ri}$ first S/D region (source) by at least, normally more than, the magnitude $V_{TR}$ of the (negative) threshold voltage of diode-configured FET $P_{Ri}$. Consequently, FET $P_{Ri}$ turns on at time $t_D$. Positive charge is transferred from capacitor $C_{Gi}$ through FET $P_{Ri}$ to capacitor $C_{Di}$. Gate voltage $V_{Gi}$ drops as cell output voltage $V_{Di}$ rises. Diode-configured FET $P_{Ri}$ thus reduces the difference between voltages $V_{Gi}$ and $V_{Di}$ when charge-transfer FET $P_{Ti}$ is turned off. Since gate voltage $V_{Gi}$ must exceed cell output voltage $V_{D1}$ by at least threshold voltage $V_{TR}$ for FET $P_{Ri}$ to be turned on and perform its voltage-reducing action, FET $P_{Ri}$ does not reduce the difference between voltages $V_{Gi}$ and $V_{Di}$ to less than $V_{TR}$.

The removal of positive charge from capacitor $C_{Gi}$ causes the voltage across capacitor $C_{Gi}$ from its lower plate to its upper plate to increase as positive charge is transferred through diode-configured FET $P_{Ri}$. The amount of increase in the voltage across capacitor $C_{Gi}$ is denoted here as $\Delta V_{CG}$. In a typical implementation, $\Delta V_{CG}$ is 2V.

Due to the reduction in gate voltage $V_{Gi}$ at time $t_D$, charge-transfer FET $P_{Ti}$ may turn on slightly at time $t_D$ even though clock voltage $V_{CKP3}$ is high. If so, some positive charge is transferred from capacitor $C_{Di-1}$ through FET $P_{Ti}$ to capacitor $C_{Di}$. Cell input voltage $V_{Di-1}$ then drops slightly as cell output voltage $V_{Di}$ rises slightly.

Clock voltage $V_{CKP3}$ transitions low at time $t_E$. Gate voltage $V_{Gi}$ drops rapidly by approximately $V_{DD}$–$V_{SS}$, causing charge-transfer FET $P_{Ti}$ to turn on if it is not already on, or to become more conductive if it is already on. Diode-configured FET $P_{Ri}$ turns off. Because FET $P_{Ri}$ caused the voltage across capacitor $C_{Gi}$ to be increased by $\Delta V_{CG}$, gate voltage $V_{Gi}$ goes approximately $\Delta V_{CG}$ lower than what would have occurred if FET $P_{Ri}$ were absent. This further reduced value of gate voltage $V_{Gi}$ causes charge-transfer FET $P_{Ti}$ to become more conductive than what would have occurred if diode-configured FET $P_{Ri}$ were absent. Diode-configured FET $P_{Ri}$ thus functions to cause charge-transfer FET $P_{Ti}$ to become more conductive when it is turned on.

Side FETs $P_{Si}$ and $P_{Di}$ respectively remain on and off when clock voltage $V_{CKP3}$ transitions low at time $t_E$ (to turn on charge-transfer FET $P_{Ti}$ if it is not already on as a result of the drop in gate voltage $V_{Gi}$ at time $t_D$, or to cause FET $P_{Ti}$ to become more conductive if it is already on). Charge-transfer FETs $P_{Ti-1}$ and $P_{Ti+1}$ remain off. Positive charge is thereby transferred from capacitor $C_{Di-1}$ through charge-transfer FET $P_{Ti}$ to capacitor $C_{Di}$. Because FET $P_{Ti}$ is more conductive than what would arise if diode-configured FET $P_{Ri}$ were absent, more charge is transferred through charge-transfer FET $P_{Ti}$ than what would occur in the absence of diode-configured FET $P_{Ri}$. This increases the charge-pumping efficiency. Although some positive charge may have flowed from capacitor $C_{Di-1}$ through charge-transfer FET $P_{Ti}$ to capacitor $C_{Di}$ during the interval from time $t_D$ to time $t_E$, the low $V_{CKP3}$ interval from time $t_E$ to time $t_F$ is the main interval for positive charge to be transferred from capacitor $C_{Di-1}$ through FET $P_{Ti}$ to capacitor $C_{Di}$ and is normally chosen to be relatively long for achieving high pump efficiency.

Cell input voltage $V_{Di-1}$ starts dropping relatively gradually at time $t_E$ as cell output voltage $V_{Di}$ starts rising relatively gradually. The low $V_{CKP3}$ interval, although relatively long for achieving high pump efficiency, is sufficiently short that voltages $V_{D1}$ and $V_{Di-1}$ do not reach each other. The $V_{Di-1}$ drop is insufficient to cause voltage-equalization FET $P_{Ei}$ to turn on. FET $P_{Ei}$ thus remains off. Body voltage $V_{Bi}$ continues to equal cell input voltage $V_{Di-1}$ and thus drops relatively gradually.

Clock voltage $V_{CKP3}$ transitions back high at time $t_F$ when cell input voltage $V_{Di-1}$ is greater than cell output voltage $V_{Di}$. Charge-transfer FET $P_{Ti}$ turns off to temporarily hold cell input voltage $V_{Di-1}$ greater than cell output voltage $V_{Di}$. FETs $P_{Ti-1}$, $P_{Ti+1}$, $P_{Di}$, and $P_{Ei}$, remain off. FETs $P_{Si}$ and $P_{Ri}$ remain on.

Clock voltage $V_{CKP1}$ goes back high at time $t_G$ as clock voltage $V_{CKP2}$ simultaneously goes back low. Cell output voltage $V_{D1}$ rapidly rises approximately $V_{DD}$–$V_{SS}$. Cell input voltage $V_{Di-1}$ rapidly drops approximately $V_{DD}$–$V_{SS}$ as does voltage $V_{Di+1}$. Second side FET $P_{Di}$ turns on as first side FET $P_{Si}$ and diode-configured FET $P_{Ri}$ turn off. Body voltage $V_{Bi}$ becomes equal to cell output voltage $V_{Di}$ and thereby increases rapidly. Charge-transfer FET $P_{T1}$ remains off. Because clock voltage $V_{CKP4}$ is high, charge-transfer FETs $P_{Ti-1}$ and $P_{Ti+1}$ remain off.

The drop of approximately $V_{DD}$–$V_{SS}$ in cell input voltage $V_{Di-1}$ at the $P_{Ei}$ gate electrode is sufficiently great that voltage-equalization FET $P_{Ei}$ turns on. The low-to-high $V_{CKP1}$ transition at time to causes cell output voltage $V_{Di}$ to exceed gate voltage $V_{Gi}$. Positive charge is thus transferred from capacitor $C_{Di}$ through voltage-equalization FET $P_{Ei}$ to capacitor $C_{Gi}$. FET $P_{Ei}$ starts performing its function to substantially equalize voltages $V_{Gi}$ and $V_{Di}$.

At time $t_H$, voltages $V_{Di}$, $V_{Di-1}$, $V_{Gi}$, and $V_{Bi}$ are respectively at substantially the same values as at time $t_A$. The interval from time $t_A$ to time $t_H$ is one cycle, or period, of the charge-pumping operation in the charge pump of FIG. 12. The variations of voltages $V_{Di}$, $V_{Di-1}$, $V_{Gi}$, and $V_{Bi}$ are largely the same in cell $120_i$ of each pump stage $122_i$. Since each charge-transfer FET $P_{T1}$ has largely the same zero back-bias threshold voltage $V_{T0}$, stage voltage gain $\Delta V_{Di}$ is largely the same for each stage $122_1$. As with the charge pump of FIG. 7, pump output voltage $V_{PP}$ in the pump of FIG. 12 increases linearly as the number n of stages $122_1$-$122_n$ increases to achieve highly efficient charge pumping.

Charge-transfer FET $P_{Ti}$ is a relatively large FET compared to side FETs $P_{Si}$ and $P_{Di}$. That is, FET $P_{Ti}$ is of considerably greater width-to-length ratio than FETs $P_{Si}$ and $P_{Di}$. Consequently, charge-transfer FET $P_{Ti}$ normally turns off more slowly than side FETs $P_{Si}$ and $P_{Di}$. Diode-configured FET $P_{Ri}$ and voltage-equalization FET $P_{Ei}$ substantially prevent positive charge on capacitor $C_{Di}$ from flowing through charge-transfer FET $P_{Ti}$ to capacitor $C_{Di-1}$ when FET $P_{Ti}$ is in the process of turning off. By substantially preventing this reverse charge transfer when FET $P_{Ti}$ is turning off, the cell pumping efficiency is increased in exchange for the inclusion of diode-configured FET $P_{Ri}$ and voltage-equalization FET $P_{Ei}$ and the use of a four-phase clocking system instead of a two-phase clocking system.

Figure 14:
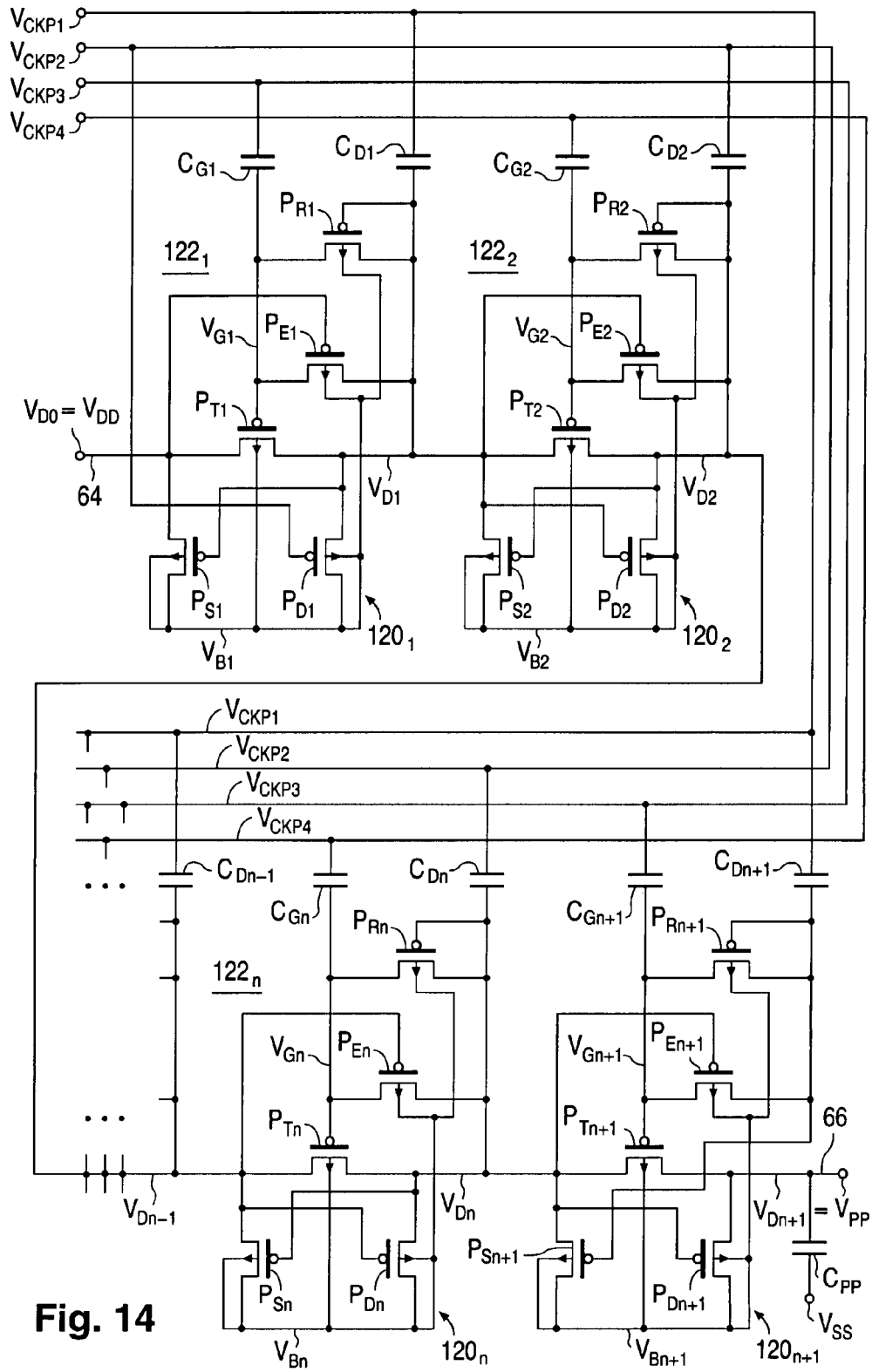
FIG. 14 is a circuit diagram of another four-phase positive charge pump according to the invention.

FIG. 14 illustrates another n-stage four-phase positive charge pump in accordance with the invention. The charge pump of FIG. 14 consists of charge-transfer cells $120_1$-$120_{n+1}$, primary pump capacitive elements $C_{D1}$-$C_{Dn}$, further pump capacitive elements $C_{G1}$-$C_{Gn}$, further capacitive element $C_{Gn+1}$, an additional capacitive element $C_{Dn+1}$, output capacitive element $C_{PP}$, and sources (again not separately shown) of clock voltages $V_{CKP1}$-$V_{CKP4}$. Except for output charge-transfer cell $120_{n+1}$ and aside from additional capacitive element $C_{Dn+1}$, charge-transfer cells $120_1$-$120_{n+1}$ and capacitive elements $C_{D1}$-$C_{Dn}$, $C_{G1}$-$C_{Gn+1}$, and $C_{pp}$ in the pump of FIG. 14 are interconnected the same as in the charge pump of FIG. 12 and operate from the $V_{DD}$ and $V_{SS}$ power supplies in response to clock voltages $V_{CKP1}$-$V_{CKP4}$ the same as in the pump of FIG. 12. Each charge-transfer cell $120_i$, primary capacitor $C_{Di}$, and further capacitor $C_{Gi}$, in the pump of FIG. 14 thereby form a stage $122_i$ of the charge pump where i here again varies from 1 to n.

As to output charge-transfer cell $120_{n+1}$ in the charge pump of FIG. 14, the second S/D region (drain) of charge-transfer FET $P_{Tn+1}$ is electrically disconnected from both the first S/D region (source) of voltage-equalization FET $P_{En+1}$ and the second S/D region (drain) of diode-configured FET $P_{Rn+1}$ rather than being electrically connected to the $P_{En+1}$ first S/D region and the $P_{Rn+1}$ second S/D region as occurs in the charge pump of FIG. 12. Hence, the $P_{Tn+1}$ second S/D region in the pump of FIG. 14 is not directly electrically connected to the gate electrode of charge-transfer FET $P_{Tn+1}$. This substantially enables gate voltage $V_{Gn+1}$ and pump output voltage $V_{PP}$ (or $V_{Dn+1}$) to be fully separate signals in the pump of FIG. 14.

The gate electrode of first side FET $P_{Sn+1}$ of output cell $120_{n+1}$ in the charge pump of FIG. 14 is electrically connected to the interconnected first S/D region of voltage-equalization FET $P_{En+1}$ and the second S/D region of diode-configured FET $P_{Rn+1}$ rather than being connected to the second S/D region of charge-transfer FET $P_{Tn-1}$ as occurs in the charge pump of FIG. 12. Additional capacitor $C_{Dn+1}$ is connected between the interconnected $P_{En+1}$ first S/D region and the FET $P_{Rn+1}$ second S/D region and (i) the $V_{CKP1}$ source if n is an even number or (ii) the $V_{CKP2}$ source if n is an odd number. FIG. 14 illustrates the example in which n is even. The remaining connections and interconnections of cell $120_{n+1}$ in the pump of FIG. 14 are the same as in the pump of FIG. 12.

As with the charge pump of FIG. 12, the connection of the $P_{D1}$ gate electrode to the $V_{CKP2}$ source avoids undesired bipolar action in first charge-transfer cell $120_1$ of the charge pump of FIG. 14 for the reasons, presented above in connection with FIG. 10a, that undesired bipolar action is avoided in first charge-transfer cell $60_1$ of the charge pump of FIG. 7 subject again to changing complementary clock voltages $V_{CKP}$ and $\overline{V}_{CK\_P}$ respectively to complementary clock voltages $V_{CKP1}$ and $V_{CKP2}$ in the explanation of FIG. 10a. The coupling of the $P_{Sn+1}$ gate electrode through capacitor $C_{Dn+1}$ to the $V_{CKP1}$ source (if n is even or the $V_{CKP2}$ source if n is odd), corresponding to the coupling of the $P_{Sn+1}$ gate electrode through capacitor $C_{Gn+1}$ to the $V_{CKP}$ source (if n is even or the $\overline{V}_{CK\_P}$ source if n is odd) in the pump of FIG. 7, avoids undesired bipolar action in output charge-transfer cell $120_{n+1}$ of the pump of FIG. 14 for the reasons, presented above in connection with FIG. 10b, that undesired bipolar action is avoided in output charge-transfer cell $60_{n+1}$ of the pump of FIG. 7 for the situation in which the $P_{Sn+1}$ gate electrode is coupled through capacitor $C_{Gn+1}$ to the $V_{CKP}$ source (again if n is even or the $\overline{V}_{CKP}$ source if n is odd) subject to changing voltages $V_{CKP}$ and $\overline{V}_{CK\_P}$ respectively to voltages $V_{CKP1}$ and $V_{CKP2}$ in the explanation of FIG. 10b and also subject to changing capacitor $C_{Cn+1}$ to capacitor $C_{Gn+1}$ in that explanation. Consequently, the pump of FIG. 12 undesired bipolar action during the entire pumping operation.

Figure 15A:
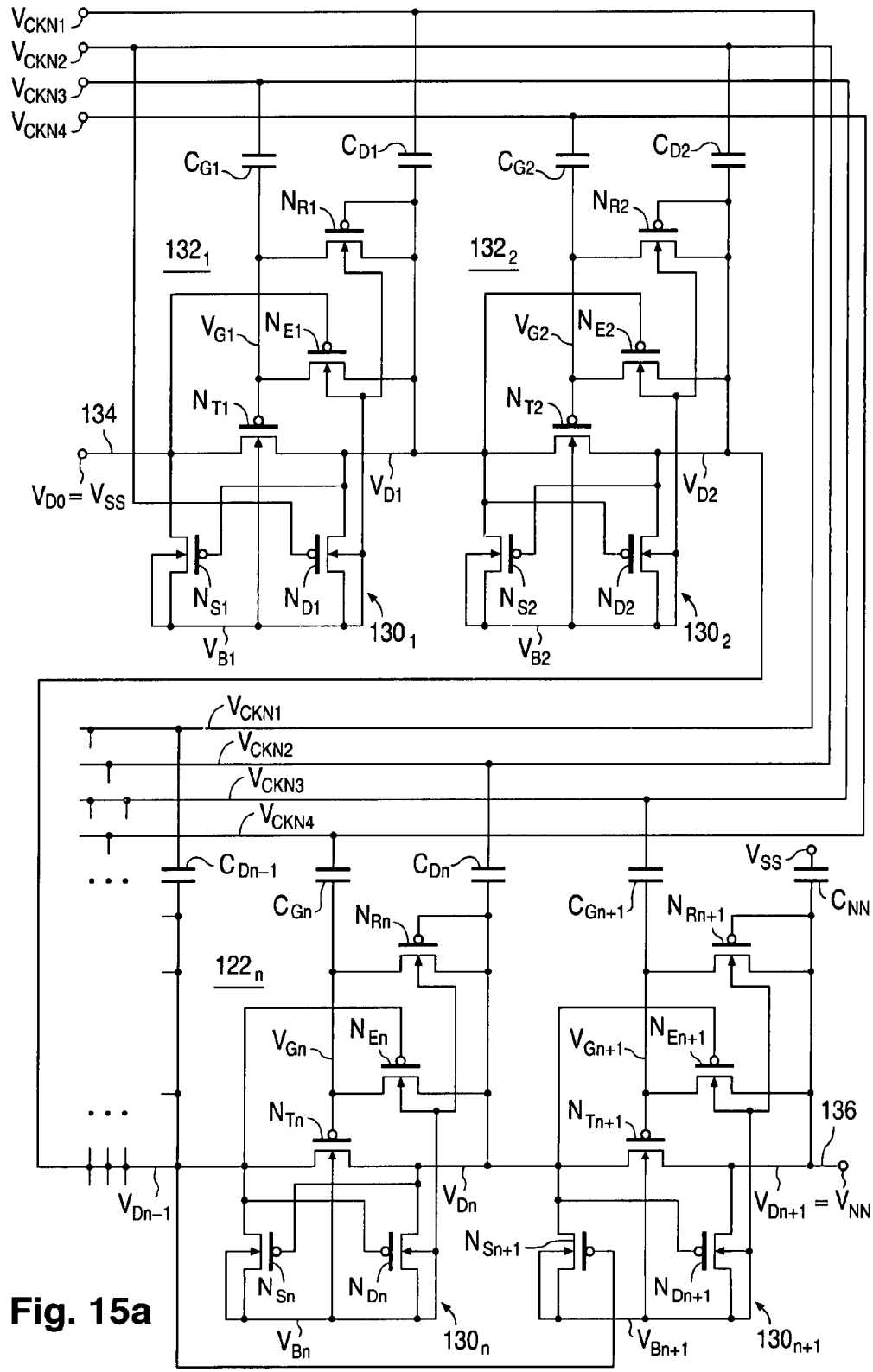

FIGS. 15a and 15b (collectively "FIG. 15") illustrate an extension of two-phase charge pump of FIG. 11 to an n-stage four-phase negative charge pump in accordance with the invention. Analogous to FIG. 12a, beginning and end portions of the four-phase negative charge pump are depicted in FIG. 15a. FIG. 15b depicts an intermediate pump portion analogous to that of FIG. 12b.

Operating from a power supply which provides supply voltages $V_{DD}$ and $V_{SS}$, the charge pump of FIG. 15 consists of n+1 charge-transfer cells $130_1$, $130_2$, ... $130_{n-1}$, $130_n$, and $130_{n+1}$ arranged in series, primary pump capacitive elements $C_{D1}$-$C_{Dn}$ respectively corresponding to cells $130_1$-$130_n$, further pump capacitive elements $C_{G1}$-$C_{Gn}$ likewise respectively corresponding to cells $130_1$-$130_n$, further (or additional) capacitive element $C_{Gn+1}$ for cell $130_{n+1}$, output capacitive element $C_{NN}$, and sources (not separately shown) of a first clock voltage signal $V_{CKN1}$, a second clock voltage $V_{CKN2}$ largely inverse to first clock voltage $V_{CKN1}$, a third clock voltage signal $V_{CKN3}$ partially in phase with first clock voltage $V_{CKN1}$, and a fourth clock voltage $V_{CKN4}$ partially in phase with second clock voltage $V_{CKN2}$. Each charge-transfer cell $130_i$, corresponding primary capacitor $C_{Di}$, and corresponding further capacitor $C_{Gi}$ form a stage $132_i$ of the charge pump where i varies from 1 to n.

Pump input voltage $V_{D0}$ is provided at a value largely equal to $V_{SS}$ on an input electrical conductor 134 to first cell $130_1$ in first stage $130_1$. Similar to the charge pump of FIG. 12, nth stage $132_n$ that contains nth cell $130_1$ is the last stage while (n+1)th cell $130_{n+1}$ is an output cell connected to an output electrical conductor 136 on which pump output voltage $V_{NN}$ is furnished at an approximately constant value less than $V_{SS}$. Output capacitor $C_{NN}$ is connected between output connector 136 and the $V_{SS}$ supply.

Charge-transfer cells $130_1$-$130_{n+1}$ are formed with enhancement-mode n-channel insulated-gate FETs configured as described above for the p-channel FETs in the charge pump of FIG. 12 except that the conductivity types are reversed. Each cell $130_i$ for i varying from 1 to n+1 consists of a charge-transfer FET $N_{Ti}$, a first side FET $N_{Si}$, a second side FET $N_{Ti}$, a voltage-equalization FET $N_{Ei}$, and a diode-configured FET $N_{Ri}$ respectively corresponding to FETs $P_{Ti}$, $P_{Si}$, $P_{Di}$, $P_{Ei}$, and $P_{Ri}$ in the pump of FIG. 12. Voltage-equalization FETs $N_{E1}$-$N_{En+1}$ are substantially identical. Diode-configured FETs $N_{R1}$-$N_{Rn+1}$ are substantially identical.

FETs $N_{T1}$-$N_{Tn+1}$, $N_{S1}$-$N_{Sn+1}$, $N_{D1}$-$N_{Dn+1}$, $N_{E1}$-$N_{En+1}$, and $N_{R1}$-$N_{Rn+1}$ are interconnected with one another and with capacitors $C_{D1}$-$C_{Dn+1}$ and $C_{G1}$-$C_{Gn+1}$ in the same manner as described above for respectively corresponding FETs $P_{T1}$-$P_{Tn+1}$, $P_{S1}$-$P_{Sn+1}$, $P_{D1}$-$P_{Dn+1}$, $P_{E1}$-$P_{En+1}$ and $P_{R1}$-$P_{Rn+1}$ in the charge pump of FIG. 12. Voltages $V_{D1}$-$V_{Dn+1}$, $V_{G1}$-$V_{Gn+1}$, and $V_{B1}$-$V_{Bn+1}$ are present at the same respective locations on FETs $N_{T1}$-$N_{Tn+1}$, $N_{S1}$-$N_{Sn+1}$, $N_{D1}$-$N_{Dn+1}$, $N_{E1}$-$N_{En+1}$, and $N_{R1}$-$N_{Rn+1}$ as on corresponding FETs $P_{T1}$-$P_{Tn+1}$, $P_{S1}$-$P_{Sn+1}$, $P_{D1}$-$P_{Dn+1}$, $P_{E1}$-$P_{En+1}$, and $P_{R1}$-$P_{Rn+1}$. The $V_{CKN1}$, $V_{CKN2}$, $V_{CKN3}$, and $V_{CKN4}$ sources are connected to capacitors $C_{D1}$-$C_{Dn+1}$ and $C_{G1}$-$C_{Gn+1}$ in the same respective ways as the $V_{CKP1}$-$V_{CKP4}$ sources.

The connection of the gate electrode of second side FET $N_{D1}$ in first cell $130_1$ differs, in accordance with the invention, from the connection of each other $N_{Di}$ gate electrode in the same way that the connection of the $P_{D1}$ gate electrode in the charge pump of FIG. 12 differs from the connection of each other $P_{Di}$ gate electrode. That is, the $N_{D1}$ gate electrode in the charge pump of FIG. 15 is connected to the $V_{CKN2}$ source. The connection of the gate electrode of first side FET $N_{Sn+1}$ in output cell $130_{n+1}$ likewise differs, in accordance with the invention, from the connection of each other $N_{Si}$ gate electrode in the same manner that the connection of the $P_{Sn+1}$ gate electrode in the pump of FIG. 12 differs from the connection of each other $P_{Si}$ gate electrode. Consequently, the $N_{Sn+1}$ gate electrode is connected to the second S/D region of charge-transfer FET $N_{Tn-1}$ in cell $130_{n-1}$ to receive output voltage $V_{Dn-1}$ from cell $130_{n-1}$.

Clock voltages $V_{CKN1}$-$V_{CKN4}$ ideally vary between $V_{SS}$ and $V_{DD}$ as generally depicted in FIG. 16. A comparison of FIG. 16 to FIG. 13 shows that clock voltages $V_{CKN1}$-$V_{CKN4}$ are basically respectively inverse to clock voltages $V_{CKP1}$-$V_{CKP4}$ utilized in the charge pump of FIG. 12.

Subject to all the voltage polarities being reversed, the charge pump of FIG. 15 operates in the same manner as the charge pump of FIG. 12. Hence, the pump of FIG. 15 avoids undesired bipolar action in first charge-transfer cell $130_1$ and output charge-transfer cell $130_{n+1}$ in the same manner that undesired bipolar action is avoided in cells $120_1$ and $120_{n+1}$ in the pump of FIG. 12 and thus in the same manner that undesired bipolar action is avoided in cells $60_1$ and $60_{n+1}$ in the charge pump of FIG. 7.

Figure 17:
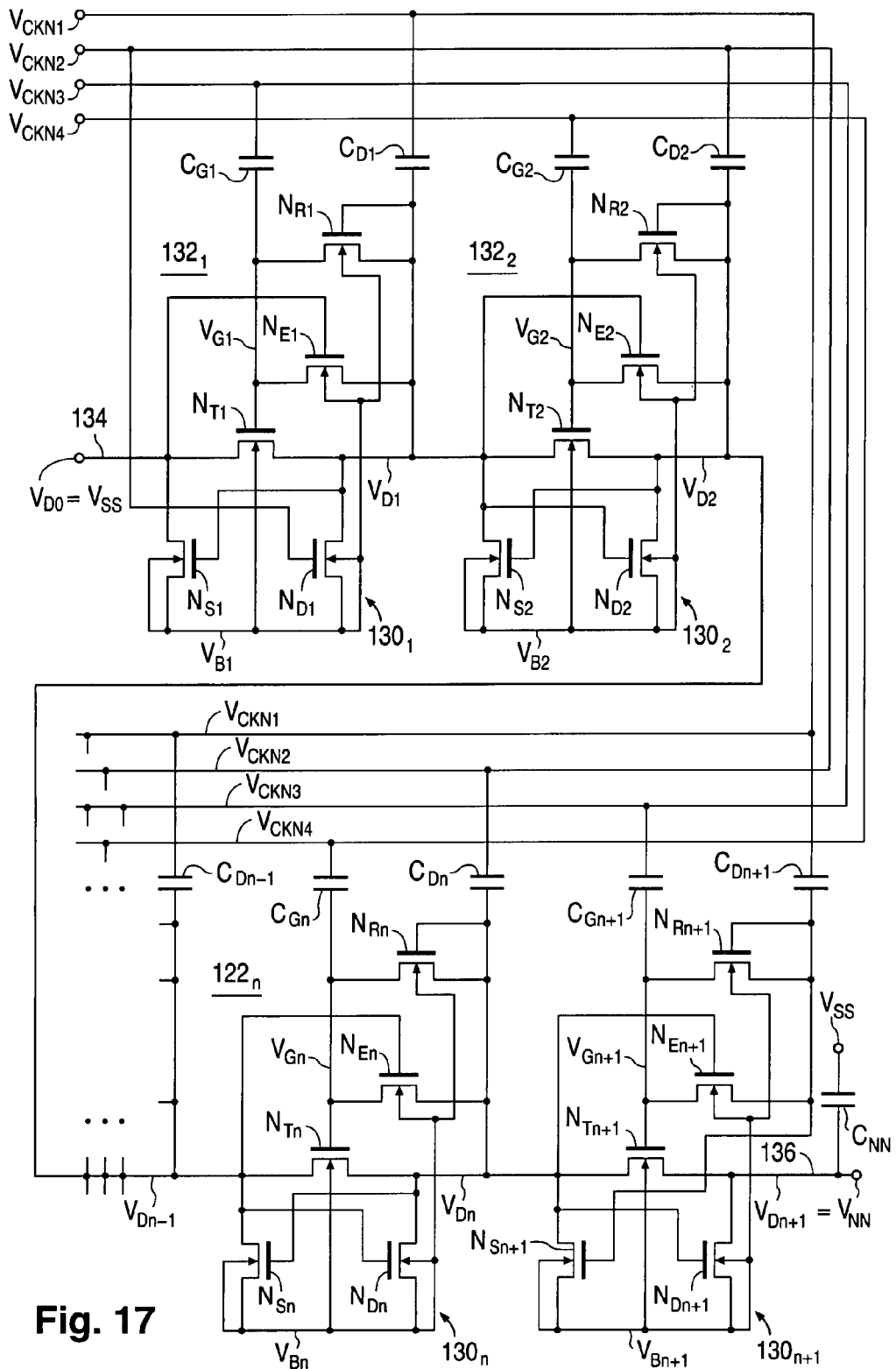
FIG. 17 is a circuit diagram of another four-phase negative charge pump according to the invention.

FIG. 17 illustrates another n-stage four-phase negative charge pump in accordance with the invention. The charge pump of FIG. 17 consists of charge-transfer cells $130_1$-$130_{n+1}$, primary pump capacitive elements $C_{D1}$-$C_{Dn}$, further pump capacitive elements $C_{G1}$-$C_{Gn}$, further capacitive elements $C_{Gn+1}$, additional capacitive element $C_{Dn+1}$, output capacitive element $C_{NN}$, and sources (again not separately shown) of clock voltages $V_{CKN1}$-$V_{CKN4}$. Except for output charge-transfer cell $130_{n+1}$ and aside from additional capacitive element $C_{Dn+1}$, charge-transfer cells $130_1$-$130_{n+1}$ and capacitive elements $C_{D1}$-$C_{Dn}$, $C_{G1}$-$C_{Gn+1}$, and $C_{NN}$ in the pump of FIG. 17 are interconnected the same as in the charge pump of FIG. 15 and operate from the $V_{DD}$ and $V_{SS}$ power supplies in response to clock voltages $V_{CKN1}$-$V_{CKN4}$ the same as in the pump of FIG. 15. Each charge-transfer cell $130_i$, primary capacitor $C_{Di}$, and further capacitor $C_{Gi}$ in the pump of FIG. 17 thus form a stage $132_i$ of the charge pump where i here again varies from 1 to n.

As to output charge-transfer cell $130_{n+1}$ and additional capacitor $C_{Dn+1}$ in the charge pump of FIG. 17, the connections of the second S/D region (drain) of charge-transfer FET $N_{Tn+1}$, the first S/D region (source) of voltage-equalization FET $N_{En+1}$, the second S/D region (drain) of diode-configured FET $N_{Rn+1}$, and the gate electrode of first side FET $N_{Sn+1}$ in the pump of FIG. 17 differ from the connections of the $N_{Tn+1}$ second S/D region, the $N_{En+1}$ first S/D region, the $N_{Rn+1}$ second S/D region, and the $N_{Sn+1}$ gate electrode in the charge pump of FIG. 15 in the same way that the $P_{Tn+1}$ second S/D region, the $P_{En+1}$ first S/D region, the $P_{Rn+1}$ second S/D region, and the $P_{Sn+1}$ gate electrode are connected differently in the charge pump of FIG. 14 than in the charge pump of FIG. 12. Additional capacitor $C_{Dn+1}$ in the pump of FIG. 17 is thereby connected between the interconnected $N_{En+1}$ first S/D region and the FET $N_{Rn+1}$ second S/D region and (i) the $V_{CKN1}$ source if n is an even number or (ii) the $V_{CKN2}$ source if n is an odd number. FIG. 17 illustrates the example in which n is even. Accordingly, gate voltage $V_{Gn+1}$ and pump output voltage $V_{NN}$ (or $V_{Dn+1}$) are fully separate signals in the pump of FIG. 17. The remaining connections and interconnections of output cell $130_{n+1}$ in the pump of FIG. 17 are the same as in the pump of FIG. 15.

Subject to all the voltage polarities being reversed, the charge pump of FIG. 17 operates in the same manner as the charge pump of FIG. 14. The pump of FIG. 17 avoids thereby undesired bipolar action in first charge-transfer cell $130_1$ and output charge-transfer cell $130_{n+1}$ in the same manner that undesired bipolar action is avoided in cells $120_1$ and $120_{n+1}$ in the pump of FIG. 14 and thus in the same manner that undesired bipolar action is avoided in cells $60_1$ and $60_{n+1}$ in the charge pump of FIG. 7.

While the invention has been described with reference to particular embodiments, this description is solely for the purpose of illustration and is not to be construed as limiting the scope of the invention claimed below. For example, the gate electrode of each voltage-equalization FET $P_{Ei}$ or $N_{Ei}$ for i varying from 1 to n+1 can be connected to its second S/D region (drain) in a diode configuration to receive gate voltage $V_{Gi}$. In that case, FET $P_{Ei}$ or $N_{Ei}$ reduces the difference between gate voltage $V_{Gi}$ and cell output voltage $V_{Di}$ when charge-transfer FET $P_{Ti}$ or $N_{Ti}$ is turned off but does not cause voltages $V_{Gi}$ and $V_{Di}$ to become substantially equal to each other. Instead, FET $P_{Ei}$ or $N_{Ei}$ causes cell output voltage $V_{Di}$ to substantially equal gate voltage $V_{Gi}$ plus the threshold voltage $V_{TE}$ of FET $P_{Ei}$ or $N_{Ei}$. That is, FET $P_{Ei}$ or $N_{Ei}$ substantially reduces the difference between voltages $V_{Gi}$ and $V_{Di}$ to $V_{TE}$ when charge-transfer FET $P_{Ti}$ or $N_{Ti}$ is turned off.

Clock voltages $V_{CKP1}$ and $V_{CKP3}$ can make low-to-high transitions largely simultaneously rather than having voltage $V_{CKP3}$ make a low-to-high transition while voltage $V_{CKP1}$ is low. Similarly, clock voltages $V_{CKP2}$ and $V_{CKP4}$ can make low-to-high transitions largely simultaneously rather than having voltage $V_{CKP4}$ make a low-to-high transition while voltage $V_{CKP2}$ is low. In a complementary manner, clock voltages $V_{CKN1}$ and $V_{CKN3}$ can make high-to-low transitions largely simultaneously rather than having voltage $V_{CKN4}$ make a high-to-low transition while voltage $V_{CKN1}$ is high. Clock voltages $V_{CKN2}$ and $V_{CKN4}$ can make high-to-low transitions largely simultaneously rather than having voltage $V_{CKN4}$ make a high-to-low transition while voltage $V_{CKN2}$ is high.

The connections of certain of side FETs $P_{S2}$-$P_{Sn}$ and $P_{D2}$-$P_{Dn}$ may be different than that described above for the charge pumps of FIGS. 7, 12, and 14. Certain of side FETs $P_{S2}$-$P_{Sn}$ and $P_{D2}$-$P_{Dn}$ may even be absent in variations of the pumps of FIGS. 7, 12, and 14. These comments similarly apply to side FETs $N_{S2}$-$N_{Sn}$ and $N_{D2}$-$N_{Dn}$ in the charge pumps FIGS. 11, 15, and 17.

Although the connections of the gate electrodes of second side FET $P_{D1}$ or $N_{D1}$ and first side FET $P_{Sn+1}$ or $N_{Sn+1}$ both preferably respectively differ cell-wise from the connections of every other $P_{Di}$ or $N_{Di}$ gate electrode and every other $P_{Si}$ or $N_{Si}$ gate electrode, the connection of every $P_{Di}$ or $N_{Di}$ gate electrode may be the same cell-wise in some variations of the present charge pumps while the connection of the $P_{Sn+1}$ or $N_{Sn+1}$ gate electrode differs cell-wise from the connection of every other $P_{Si}$ or $N_{Si}$ gate electrode. Similarly, the connection of every $P_{Sn+1}$ or $N_{Sn+1}$ gate electrode may be the same cell-wise in some variations of the present charge pumps while the connection of the $P_{D1}$ or $N_{D1}$ gate electrode differs cell-wise from the connection of every other $P_{Di}$ or $N_{Di}$ gate electrode. Various modifications and applications may thus be made by those skilled in the art without departing from the true scope of the invention as defined in the appended claims.

I claim:

1. A charge pump comprising:
   a plurality of n+1 charge-transfer cells respectively sequentially designated as the first through (n+1)th cells wherein n is at least 3, the cells containing like-polarity field-effect transistors ("FETs") each having a gate electrode and first and second source/drain ("S/D") regions separated by a channel portion of a body region where each cell comprises (a) a charge-transfer FET, (b) a first side FET whose first and second S/D regions are respectively coupled to the first S/D and body regions of the charge-transfer FET, and (c) a second side FET whose first and second S/D regions are respectively coupled to the second S/D and body regions of the charge-transfer FET, the cells being arranged in series with the second S/D region of the charge-transfer FET of each cell except the (n+1)th cell coupled to the first S/D region of the charge-transfer FET of the next cell;
   sources of first and second clock signals approximately inverse to each other, the gate electrodes of the first and second side FETs (a) of the first cell being respectively coupled to the second S/D region of the first cell's charge-transfer FET and directly to the source of the second clock signal, (b) of the (n+1)th cell being respectively coupled to a selected location in the charge pump and the first S/D region of the (n+1)th cell's charge-transfer FET, and (c) of each remaining cell being respectively coupled to the second and first S/D regions of that remaining cell's charge-transfer FET; and
   a plurality of n primary capacitive elements respectively corresponding to the first through nth cells, each primary capacitive element coupled between the second S/D region of the charge-transfer FET of the corresponding cell and (i) the source of the first clock signal if that cell is an odd-numbered cell or (ii) the source of the second clock signal if that cell is an even-numbered cell.

2. A charge pump as in claim 1 wherein the gate electrode of the first side FET of the (n+1)th cell is electrically coupled to the second S/D region of the charge-transfer FET of the (n+1)th cell.

3. A charge pump as in claim 2 wherein the primary capacitive element corresponding to the (n−1)th cell is coupled between the gate electrode of the first side FET of the (n+1)th cell and (i) the source of the first clock signal if n is an even number or (ii) the source of the second clock signal if n is an odd number.

4. A charge pump as in claim 1 wherein:
   the gate electrode and second S/D region of the (n+1)th cell's charge-transfer FET are substantially electrically decoupled from each other; and
   the gate electrode of the first side FET of the (n+1)th cell is electrically coupled to the gate electrode of that cell's charge-transfer FET.

5. A charge pump as in claim 4 further including an additional capacitive element coupled between the gate electrode of the (n+1)th cell's charge-transfer FET and (i) the source of the first clock signal if n is an even number or (ii) the source of the second clock signal if n is an odd number.

6. A charge pump as in claim 1 further including an additional capacitive element coupled between the gate electrode of the (n+1)th cell's first side FET and (i) the source of the first clock signal if n is an even number or (ii) the source of the second clock signal if n is an odd number.

7. A charge pump as in claim 6 wherein the gate electrode and second S/D region of the (n+1)th cell's charge-transfer FET are not directly electrically connected to each other, the charge pump further including at least one additional FET having its S/D regions coupled respectively to the gate electrodes of the (n+1)th cell's charge-transfer and first side FETs.

8. A charge pump as in claim 1 further including circuitry for providing the gate electrode of the charge-transfer FET (a) of each odd-numbered cell with a control signal synchronized to the first clock signal and (b) of each even-numbered cell with a control signal synchronized to the second clock signal.

9. A charge pump as in claim 8 wherein the body region of each side FET is electrically coupled to its second S/D region.

10. A charge pump as in claim 1 wherein the gate electrode of the charge-transfer FET of each of the first through nth cells is connected to the second S/D region of that charge-transfer FET.

11. A charge pump as in claim 1 further including:
    sources of third and fourth clock signals different from the first and second clock signals, the four clock signals all varying substantially between first and second voltage values, the third clock signal being substantially at the first voltage value during pumping operation only during part of each time interval that the first clock signal is substantially at the first voltage value, the fourth clock signal being substantially at the first voltage value during pumping operation only during part of each time interval that the second clock signal is substantially at the first voltage value; and
    a plurality of n+1 further capacitive elements respectively corresponding to the n+1 cells, each further capacitive element coupled between the gate electrode of the charge-transfer FET of the corresponding cell and (i) the source of the third clock signal if that cell is an odd-numbered cell or (ii) the source of the fourth clock signal if that cell is an even-numbered cell.

12. A charge pump as in claim 11 wherein the gate electrode of the first side FET of the (n+1)th cell is electrically coupled to the second S/D region of the charge-transfer FET of the (n−1)th cell.

13. A charge pump as in claim 12 wherein the primary capacitive element corresponding to the (n−1)th cell is coupled between the gate electrode of the first side FET of the (n+1)th cell and (i) the source of the first clock signal if n is an even number or (ii) the source of the second clock signal if n is an odd number.

14. A charge pump as in claim 11 further including an additional capacitive element coupled between the gate electrode of the (n+1)th cell's first side FET and (i) the source of the first clock signal if n is an even number or (ii) the source of the second clock signal if n is an odd number.

15. A charge pump as in claim 14 wherein the gate electrode and second S/D region of the (n+1)th cell's charge-transfer FET are not directly electrically connected to each other, the charge pump further including at least one additional FET having its S/D regions coupled respectively to the gate electrodes of the (n+1)th cell's charge-transfer and first side FETs.

16. A charge pump as in claim 11 wherein the body region of each side FET is electrically coupled to its second S/D region.

17. A charge pump as in claim 11 wherein the first clock signal is substantially at the second voltage value during pumping operation only during part of each time interval that the third clock signal is substantially at the second voltage value, and the second clock signal is substantially at the second voltage value during pumping operation only during part of each time interval that the fourth clock signal is substantially at the second voltage value.

18. A charge pump as in claim 11 wherein the third clock signal transitions substantially from the second voltage value to the first voltage value during pumping operation between (a1) when the first clock signal transitions substantially from the second voltage value to the first voltage value and (b1) when the first clock signal immediately thereafter transitions back to the second voltage value, and the fourth clock signal transitions substantially from the second voltage value to the first voltage value during pumping operation between (a2) when the second clock signal transitions substantially from the second voltage value to the first voltage value and (b2) when the second clock signal immediately thereafter transitions substantially back to the second voltage value.

19. A charge pump as in claim 11 wherein the third clock signal transitions substantially from the second voltage value to the first voltage value and back to the second voltage value during pumping operation between (a1) when the first clock signal transitions substantially from the second voltage value to the first voltage value and (b1) when the first clock signal immediately thereafter transitions substantially back to the second voltage value, and the fourth clock signal transitions substantially from the second voltage value to the first voltage value and back to the second voltage value during pumping operation between (a2) when the second clock signal transitions substantially from the second voltage value to the first voltage value and (b2) when the second clock signal immediately thereafter transitions substantially back to second voltage value.

20. A charge pump as in claim 11 wherein the charge-transfer FET of each cell turns on in response, through the corresponding further capacitive element, to (i) the third clock signal transitioning from the second voltage value to the first voltage value if that cell is an odd-numbered cell or (ii) the fourth clock signal transitioning substantially from the second voltage value to the first voltage value if that cell is an even-numbered cell.

21. A charge pump as in claim 11 wherein each cell includes circuitry for causing that cell's charge-transfer FET to turn on more strongly when it is turned on.

22. A charge pump as in claim 21 wherein the causing circuitry of each of the first through nth cells is coupled between the gate electrode and second S/D region of that cell's charge-transfer FET.

23. A charge pump as in claim 22 wherein the causing circuitry of the (n+1)th cell is coupled between the gate electrode and second S/D region of the (n+1)th cell's charge-transfer FET.

24. A charge pump as in claim 22 wherein the causing circuitry of the (n+1)th cell is coupled between the gate electrodes of the (n+1)th cell's charge-transfer and first side FETs.

25. A charge pump as in claim 24 further including an additional capacitive element coupled between the gate electrode of the (n+1)th cell's first side FET and (i) the source of the first clock signal if n is an even number or (ii) the source of the second clock signal if n is an odd number.

26. A charge pump as in claim 25 wherein the gate electrode and second S/D region of the (n+1)th cell's charge-transfer FET are not directly electrically connected to each other.

27. A charge pump as in claim 22 wherein the causing circuitry of each cell comprises a rectifier.

28. A charge pump as in claim 11 wherein each of the first through nth cells includes circuitry for reducing the voltage difference between voltages at the gate electrode and second S/D region of that cell's charge-transfer FET when it is turned off.

29. A charge pump as in claim 28 wherein each of the first through nth cells further includes circuitry for causing that cell's charge-transfer FET to turn on more strongly when it is turned on.

30. A charge pump as in claim 11 wherein each of the first through nth cells further includes a diode-configured FET whose first S/D region is coupled to the gate electrode of that cell's charge-transfer FET and whose gate electrode and second S/D region are commonly coupled to the second S/D region of that cell's charge-transfer FET.

31. A charge pump as in claim 11 wherein each of the first through nth cells further includes a voltage-equalization FET whose first S/D region, gate electrode, and second S/D region are respectively coupled to the second S/D region, first S/D region, and gate electrode of that cell's charge-transfer FET.

32. A charge pump as in claim 31 wherein each of the first through nth cells includes diode-configured FET whose first S/D region is coupled to the gate electrode of that cell's charge-transfer FET and whose gate electrode and second S/D region are commonly coupled to the second S/D region of that cell's charge-transfer FET.

33. A charge pump comprising:
a plurality of n+1 charge-transfer cells respectively sequentially designated as the first through (n+1)th cells wherein n is at least 3, the cells comprising like-polarity field-effect transistors ("FETs") each having a gate electrode and first and second source/drain ("S/D") regions separated by a channel portion of a body region where each cell comprises (a) a charge-transfer FET, (b) a first side FET whose first and second S/D regions are respectively coupled to the first S/D and body regions of the charge-transfer FET, and (c) a second side FET whose first and second S/D regions are respectively coupled to the second S/D and body regions of the charge-transfer FET, the cells being arranged in series with the second S/D region of the charge-transfer FET of each cell except the (n+1)th cell coupled to the first S/D region of the charge-transfer FET of the next cell;
sources of first and second clock signals approximately inverse to each other, the gate electrodes of the first and second side FETs (a) of the first cell being respectively coupled to the second S/D region of the first cell's charge-transfer FET and a selected location in the charge pump, (b) of the (n+1)th cell being respectively coupled to the gate electrode of the (n−1)th cell's charge-transfer FET and the first S/D region of the (n+1)th cell's charge-transfer FET, and (c) of each remaining cell being respectively coupled to the second and first S/D regions of that remaining cell's charge-transfer FET; and
a plurality of n primary capacitive elements respectively corresponding to the first through nth cells, each primary capacitive element coupled between the second S/D region of the charge-transfer FET of the corresponding cell and (i) the source of the first clock signal if that cell is an odd-numbered cell or (ii) the source of the second clock signal if that cell is an even-numbered cell.

34. A charge pump as in claim 33 wherein the primary capacitive element corresponding to the (n−1)th cell is coupled between the gate electrode of the first side FET of the (n+1)th cell and (i) the source of the first clock signal if n is an even number or (ii) the source of the second clock signal if n is an odd number.

35. A charge pump as in claim 33 further including circuitry for providing the gate electrode of the charge-transfer FET (a) of each odd-numbered cell with a control signal synchronized to the first clock signal and (b) of each even-numbered cell with a control signal synchronized to the second clock signal.

36. A charge pump as in claim 33 wherein the gate electrode of the charge-transfer FET of each of the first through nth cells is connected to the second S/D region of that charge-transfer FET.

37. A charge pump as in claim 36 further including an additional capacitive element coupled between the gate electrode of the (n+1)th cell's charge-transfer FET and (i) the source of the first clock signal if n is an odd number or (ii) the source of the second clock signal if n is an even number.

38. A charge pump as in claim 33 further including:
sources of third and fourth clock signals different from the first and second clock signals, the four clock signals all varying substantially between first and second voltage values, the third clock signal being substantially at the first voltage value during pumping operation only during part of each time interval that the first clock signal is substantially at the first voltage value, the fourth clock signal being substantially at the first voltage value during pumping operation only during part of each time interval that the second clock signal is substantially at the first voltage value; and
a plurality of n+1 further capacitive elements respectively corresponding to the n+1 cells, each further capacitive element coupled between the gate electrode of the charge-transfer FET of the corresponding cell and (i) the source of the third clock signal if that cell is an odd-numbered cell or (ii) the source of the fourth clock signal if that cell is an even-numbered cell.

39. A charge pump comprising:
a plurality of n+1 charge-transfer cells respectively sequentially designated as the first through (n+1)th cells wherein n is at least 3, the cells comprising like-polarity field-effect transistors ("FETs") each having a gate electrode and first and second source/drain ("S/D") regions separated by a channel portion of a body region where each cell comprises (a) a charge-transfer FET, (b) a first side FET whose first and second S/D regions are respectively coupled to the first S/D and body regions of the charge-transfer FET, and (c) a second side FET whose first and second S/D regions are respectively coupled to the second S/D and body regions of the charge-transfer FET, the cells being arranged in series with the second S/D region of the charge-transfer FET of each cell except the (n+1)th cell coupled to the first S/D region of the charge-transfer FET of the next cell, the gate electrode and second S/D region of the (n+1)th cell's charge-transfer FET being substantially electrically decoupled from each other;
sources of first and second clock signals approximately inverse to each other, the gate electrodes of the first and second side FETs (a) of the first cell being respectively coupled to the second S/D region of the first cell's charge-transfer FET and a selected location in the charge pump, (b) of the (n+1)th cell being respectively coupled to the gate electrode of the (n+1)th cell's charge-transfer FET and the first S/D region of the (n+1)th cell's charge-transfer FET, and (c) of each remaining cell being respectively coupled to the second and first S/D regions of that remaining cell's charge-transfer FET;
a plurality of n primary capacitive elements respectively corresponding to the first through nth cells, each primary capacitive element coupled between the second S/D region of the charge-transfer FET of the corresponding cell and (i) the source of the first clock signal if that cell is an odd-numbered cell or (ii) the source of the second clock signal if that cell is an even-numbered cell; and
an additional capacitive element coupled between the gate electrode of the (n+1)th cell's charge-transfer FET and (i) the source of the first clock signal if n is an even number or (ii) the source of the second clock signal if n is an odd number.

40. A charge pump comprising:
a plurality of n+1 charge-transfer cells respectively sequentially designated as the first through (n+1)th cells wherein n is at least 3, the cells comprising like-polarity field-effect transistors ("FETs") each having a gate electrode and first and second source/drain ("S/D") regions separated by a channel portion of a body region where each cell comprises (a) a charge-transfer FET, (b) a first side FET whose first and second S/D regions are respectively coupled to the first S/D and body regions of the charge-transfer FET, and (c) a second side FET whose first and second S/D regions are respectively coupled to the second S/D and body regions of the charge-transfer FET, the cells being arranged in series with the second S/D region of the charge-transfer FET of each cell except the (n+1)th cell coupled to the first S/D region of the charge-transfer FET of the next cell, the gate electrode and second S/D region of the (n+1)th cell's charge-transfer FET being substantially electrically decoupled from each other;
sources of first and second clock signals approximately inverse to each other;
sources of third and fourth clock signals different from the first and second clock signals, the four clock signals all varying substantially between first and second voltage values, the third clock signal being substantially at the first voltage value during pumping operation only during part of each time interval that the first clock signal is substantially at the first voltage value, the fourth clock signal being substantially at the first voltage value during pumping operation only during part of each time interval that the second clock signal is substantially at the first voltage value;
a plurality of n primary capacitive elements respectively corresponding to the first through nth cells, each primary capacitive element coupled between the second S/D region of then charge-transfer FET of the corresponding cell and (i) the source of the first clock signal if that cell is an odd-numbered cell or (ii) the source of the second clock signal if that cell is an even-numbered cell;
a plurality of n+1 further capacitive elements respectively corresponding to the n+1 cells, each further capacitive element coupled between the gate electrode of the charge-transfer FET of the corresponding cell and (i) the source of the third clock, signal if that cell is an odd-numbered cell or (ii) the source of the fourth clock signal if that cell is an even-numbered cell; and an additional capacitive element coupled to (I) the source of the first clock signal if n is an even number or (ii) the source of the second clock signal if n is an odd number, the gate electrodes of the first and second side FETs (a) of the first cell being respectively coupled to the second S/D region of the first cell's charge.-transfer FET and a selected location in the charge pump, (b) of the (n+1)th cell being respectively coupled to the additional capacitive element and the first S/D region of the (n+1)th cell's charge-transfer FET and (c) of each remaining cell being respectively coupled to the second and first S/D regions of that in remaining cell's charge-transfer FET.

41. A charge pump as in claim 40 wherein the gate electrode and second S/D region of the (n+1)th cell's charge-transfer FET are not directly electrically connected to each other, the charge pump further including at least one additional FET having its S/D regions coupled respectively to the gate electrodes of the (n+1)th cell's charge-transfer and first side FETs.

42. A charge pump comprising:
a plurality of n+1 charge-transfer cells respectively sequentially designated as the first through (n+1)th cells wherein n is at least 3, the cells employing like-polarity field-effect transistors ("FETs") each having a gate electrode and first and second source/drain ("S/D") regions separated by a channel portion of a body region where each cell comprises a charge-transfer FET and where each of the first and (n+1)th cells further includes(a) a first side FET whose first and second S/D regions are respectively coupled to the first S/D and body regions of that cell's charge-transfer FET and (b) a second side FET whose first and second S/D regions are respectively coupled to the second S/D and body regions of that cell's charge-transfer FET, the cells being arranged in series with the second S/D region of the charge-transfer FET of each cell except the (n+1)th cell coupled to the first S/D region of the charge-transfer FET of the next cell;
sources of first and second clock signals approximately inverse to each other, the gate electrodes of the first and second side FETs (a) of the first cell being respectively coupled to the second S/D region of the first cell's charge-transfer FET and directly to the source of the second clock signal and (b) of the (n+1)th cell being respectively coupled to a selected location in the charge pump and the first S/D region of the (n+1)th cell's charge-transfer; and
a plurality of n primary capacitive elements respectively corresponding to the first through nth cells, each primary capacitive element coupled between the second S/D region of the charge-transfer FET of the corresponding cell and (i) the source of the first clock signal if that cell is an odd-numbered cell or (ii) the source of the second clock signal if that cell is an even-numbered cell.

43. A charge pump as in claim 42 wherein the gate electrode of the first side Avenue FET of the (n+1)th cell is electrically coupled to the second S/D region of the charge-transfer FET of the (n−1)th cell.

44. A charge pump as in claim 43 wherein the primary capacitive element corresponding to the (n−1)th cell is coupled between the gate electrode of the first side FET of the (n+1)th cell and (i) the source of the first clock signal if n is an even number or (ii) the source of the second clock signal if n is an odd number.

45. A charge pump as in claim 42 wherein:
the gate electrode and second S/D region of the (n+1)th cell's charge-transfer FET are substantially electrically decoupled from each other; and
the gate electrode of the first side FET of the (n+1)th cell is electrically coupled to the gate electrode of that cell's charge-transfer FET.

46. A charge pump as in claim 45 further including an additional capacitive element coupled between the gate electrode of the (n+1)th cell's-charge-transfer FET and (i) the source of the first clock signal if n is an even number or (ii) the source of the second clock signal if n is an odd number.

47. A charge pump as in claim 42 further including an additional capacitive element coupled between the gate electrode of the (n+1)th. cell's first side FET and (i) the source of the first clock signal if n is an even number or (ii) the source of the second clock signal if n is an odd number.

48. A charge pump as in claim 47 further including at least one additional FET having its S/D regions coupled respectively to the gate electrodes of the (n+1)th cell's charge-transfer and first side FETs.

49. A charge pump as in claim 42 further including circuitry for providing the gate electrode of the charge-transfer FET (a) of each odd-numbered cell with a control signal synchronized to the first clock signal and (b) of each even-numbered cell with a control signal synchronized to the second clock, signal.

50. A charge pump as in claim 43 wherein the gate electrode of the first side FET of the (n+1)th cell is electrically coupled to the second S/D region of the charge-transfer FET of the (n−1)th cell.

51. A charge pump as in claim 42 further including:
sources of third and fourth clock signals different from the first and second clock signals, the four clock signals all varying substantially between first and second voltage values, the third clock signal being substantially at the first voltage value during pumping operation only during part of each time interval that the first clock signal is substantially at the first voltage value, the fourth clock signal being substantially at the first voltage value during pumping operation only during part of each time interval that the second clock signal is substantially at the first voltage value; and
a plurality of n+1 further capacitive elements respectively corresponding to the n+1 cells, each further capacitive element coupled between the gate electrode of the charge-transfer FET of the corresponding cell and (i) the source of the third clock signal if that cell is an odd-numbered cell or (ii) the source of the fourth clock signal if that cell is an even-numbered cell.

52. A charge pump comprising:
a plurality of n+1 charge-transfer cells respectively sequentially designated as the first through (n+1)th cells wherein n is at least 3, the tells employing like-polarity field-effect transistors ("FETs") each having a gate electrode and first and second source/drain ("S/D") regions separated by a channel portion of a body region where each cell comprises a charge-transfer FET and where each of the first and (n+1 )th cells further includes (a) a first side FET whose first and second S/D regions are respectively coupled to the first S/D and body regions of that cell's charge-transfer FET and (b) a second side FET whose first and second S/D regions are respectively coupled to the second S/D and body regions of that cell's charge-transfer FET, the cells being arranged in series with the second S/D region of the charge-transfer FET of each cell except the (n+1)th cell coupled to the first S/D region of the charge-transfer FET of the next cell;

sources of first and second clock signals approximately inverse to each other, the gate electrodes of the first and second side FETs (a) of the first cell being respectively coupled to the second S/D region of the first cell's charge-transfer FET and a selected location in the charge pump and (b) of the (n+1)th cell being respectively coupled to the second S/D region of the (n−1)th cell's charge-transfer FET and the first S/D region of the (n+1)th cell's charge-transfer FET; and a plurality of n primary capacitive elements respectively corresponding to the first through nth cells, each primary capacitive element coupled between the second S/D region of the charge-transfer FET of the corresponding cell and (i) the source of the first clock signal if that cell is an odd-numbered cell or (ii) the source of the second clock signal if that cell is an even-numbered cell.

53. A charge pump as in claim 52 wherein the primary capacitive element corresponding to the (n−1)th cell is coupled between the gate electrode of the first side FET of the (n+1)th cell and (i) the source of the first clock signal if n is an even number or (ii) the source of the second clock signal if n is an odd number.

54. A charge pump as in claim 52 further including circuitry for providing the gate electrode of the charge-transfer FET (a) of each odd-numbered cell with a control signal synchronized to the first clock signal and (b) of each even-numbered cell with a control signal synchronized to the second clock signal.

55. A charge pump as in claim 52 further including:

sources of third and fourth clock signals different from the first and second clock signals, the four clock signals all varying substantially between first and second voltage values, the third clock signal being substantially at the first voltage value during pumping operation only during part of each time interval that the first clock signal is substantially at the first voltage value, the fourth clock signal being substantially at the first voltage value during pumping operation only during part of each time interval that the second clock signal is substantially at the first voltage value; and a plurality of n+1 further capacitive elements respectively corresponding to the n+1 cells, each further capacitive element coupled between the gate electrode of the charge-transfer FET of the corresponding cell and (i) the source of the third clock signal if that cell is an odd-numbered cell or (ii) the source of the fourth clock signal if that cell is an even-numbered cell.

56. A charge pump as in claim 39 further including circuitry for providing the gate electrode of the charge-transfer FET (a) of each odd-numbered cell before the last cell with a control signal synchronized to the first clock signal and (b) of each even-numbered cell before the last cell with a control signal synchronized to the second clock signal.

* * * * *